(12) United States Patent
Yamazaki et al.

(10) Patent No.: US 10,656,453 B2
(45) Date of Patent: May 19, 2020

(54) DISPLAY DEVICE, INPUT/OUTPUT DEVICE, AND SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 122 days.

(21) Appl. No.: 15/627,994

(22) Filed: Jun. 20, 2017

(65) Prior Publication Data
US 2017/0371187 A1    Dec. 28, 2017

(30) Foreign Application Priority Data

Jun. 24, 2016   (JP) .................................. 2016-125126

(51) Int. Cl.
*G02F 1/1335* (2006.01)
*G09G 3/3233* (2016.01)
(Continued)

(52) U.S. Cl.
CPC ...... *G02F 1/1335* (2013.01); *G02F 1/133514* (2013.01); *G02F 1/133553* (2013.01); (Continued)

(58) Field of Classification Search
CPC ......... G02F 1/133553; G02F 1/133603; G02F 1/133514; G02F 1/133528;
(Continued)

(56) References Cited

U.S. PATENT DOCUMENTS 5,796,509 A * 8/1998 Doany .............. G02F 1/133603
                                                    359/254
6,714,268 B2    3/2004 Wang et al.
(Continued)

FOREIGN PATENT DOCUMENTS

JP    2001-066593 A    3/2001
JP    2002-196702 A    7/2002
(Continued)

OTHER PUBLICATIONS

Vishay Siliconix, "P-Channel MOSFETs, the Best Choice for High-Side Switching", Mar. 10, 1997 (Year: 1997).*
(Continued)

*Primary Examiner* — Dong Hui Liang
(74) *Attorney, Agent, or Firm* — Husch Blackwell LLP

(57) ABSTRACT

A display device with high visibility or low power consumption is provided. The display device includes a self-luminous display element and a reflective display element. The reflective display element includes a light-reflective layer and a liquid crystal material. The self-luminous display element transmits visible light. The liquid crystal material is located between the light-reflective layer and the self-luminous display element. The display device further includes a polarizing plate located between the liquid crystal material and the self-luminous display element. Alternatively, the self-luminous display element is preferably located between the liquid crystal material and the polarizing plate. The display device further preferably includes one or more coloring films located between the liquid crystal material and the self-luminous display element.

9 Claims, 22 Drawing Sheets

(51) Int. Cl.
*G09G 3/22* (2006.01)
*H01S 5/42* (2006.01)
*H01L 27/15* (2006.01)
*H01L 27/32* (2006.01)

(52) U.S. Cl.
CPC ............ *G09G 3/22* (2013.01); *G09G 3/3233* (2013.01); *H01L 27/156* (2013.01); *H01L 27/3232* (2013.01); *H01L 27/3267* (2013.01); *H01S 5/423* (2013.01); *G02F 2201/44* (2013.01); *G09G 2300/0866* (2013.01); *H01L 27/323* (2013.01); *H01L 2227/323* (2013.01)

(58) Field of Classification Search
CPC ............ G02F 1/133605; G02F 1/1368; G02F 1/133536; G02F 2001/133616; G09G 2360/144; G09G 3/3406; G09G 3/3413; G09G 2330/021; G09G 2300/0456
See application file for complete search history.

(56) References Cited

U.S. PATENT DOCUMENTS

| | | | |
|---|---|---|---|
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,385,654 B2 | 6/2008 | Mitsui et al. | |
| 8,367,440 B2 | 2/2013 | Takayama et al. | |
| 8,415,208 B2 | 4/2013 | Takayama et al. | |
| 9,202,987 B2 | 12/2015 | Takayama et al. | |
| 2002/0145687 A1* | 10/2002 | Mitsui ............... G02F 1/133603 349/113 | |
| 2003/0201960 A1 | 10/2003 | Fujieda | |
| 2003/0230972 A1* | 12/2003 | Cok ................... H01L 27/3211 313/504 | |
| 2004/0141106 A1* | 7/2004 | Wu .................. G02F 1/133603 349/69 | |
| 2006/0072047 A1 | 4/2006 | Sekiguchi | |
| 2006/0132671 A1* | 6/2006 | Koma ............... G02F 1/133512 349/63 | |
| 2006/0261337 A1* | 11/2006 | Koma ............... G02F 1/133603 257/59 | |
| 2006/0262242 A1* | 11/2006 | Koma .................. G02F 1/1336 349/69 | |
| 2008/0180618 A1 | 7/2008 | Fujieda | |
| 2010/0171905 A1 | 7/2010 | Huang et al. | |
| 2010/0214245 A1* | 8/2010 | Hirota ................. G02F 1/13338 345/173 | |
| 2011/0062863 A1* | 3/2011 | Hsiao ................. G02F 1/133603 313/505 | |
| 2016/0079283 A1 | 3/2016 | Takayama et al. | |
| 2017/0068362 A1* | 3/2017 | Den Boer ............. G06F 3/0412 | |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-174153 A | 6/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2013-221965 A | 10/2013 |
| WO | WO-2004/053819 A1 | 6/2004 |

OTHER PUBLICATIONS

Shieh, H-P., "Transflective Display by Hybrid OLED and LCD," LEOS 2005 (IEEE Lasers and Electro-Optics Society Annual Meeting), Oct. 22, 2005, pp. 650-651, IEEE.

Lee, J-H. et al., "High Ambient-Contrast-Ratio Display Using Tandem Reflective Liquid Crystal Display and Organic Light-Emitting Device," Optics Express, Nov. 14, 2055, vol. 13, No. 23, pp. 9431-9438.

Kusunoki, K. et al., "Transmissive OLED and Reflective LC Hybrid (TR-Hybrid) Display," SID Digest '16: SID International Symposium Digest of Technical Papers, 2016, vol. 47, pp. 57-60.

Sakuishi, T. et al., "Transmissive OLED and Reflective LC Hybrid (TR-Hybrid) Display with High Visibility and Low Power Consumption," SID Digest '16: SID International Symposium Digest of Technical Papers, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, 2016, 2016, vol. 47, pp. 1002-1004.

* cited by examiner

DISPLAY DEVICE, INPUT/OUTPUT DEVICE, AND SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a display device, an input/output device, a semiconductor device, a light-emitting device, an electronic device, a lighting device, a driving method thereof, or a manufacturing method thereof. In particular, one embodiment of the present invention relates to a display device (display panel). One embodiment of the present invention relates to an input/output device, a semiconductor device, an electronic device, a light-emitting device, or a lighting device that includes a display device, or a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, a light-emitting device, a display device, an electronic device, and a lighting device each may include a semiconductor device.

2. Description of the Related Art

It is known that an active matrix liquid crystal display device is classified into two major types: transmissive type and reflective type. In the transmissive liquid crystal display device, a backlight such as a cold cathode fluorescent lamp or a light emitting diode (LED) is used, and optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, those images are combined to perform image display.

In a reflective liquid crystal display device, a state in which external light, that is, incident light is reflected at a pixel electrode and output to the outside of the device or a state in which incident light is not output to the outside of the device is selected using optical modulation action of liquid crystal, whereby bright and dark images are displayed. Furthermore, those displays are combined to display an image. Compared to the transmissive liquid crystal display device, the reflective liquid crystal display device has the advantage of low power consumption since the backlight is not used. Patent Document 1 discloses a flexible active matrix light-emitting device in which a transistor and an organic EL element are provided over a film substrate.

REFERENCE

[Patent Document]
[Patent Document 1] Japanese Published Patent Application No. 2003-174153

SUMMARY OF THE INVENTION

It is required to reduce the power consumption of an electronic device including a display device. In particular, reducing the power consumption of display devices is needed in devices using batteries as power sources because the display devices consume significant power in such devices. Furthermore, portable electronic devices need to include display devices which can perform display with high visibility regardless of whether they are used indoors or outdoors.

An object of one embodiment of the present invention is to provide a display device with high visibility. Another object is to provide a display device capable of a variety of display. Another object is to provide a display device with low power consumption. Another object is to provide a novel display device. Another object is to provide a semiconductor device including the display device (display panel). Another object is to provide a novel semiconductor device.

Note that the descriptions of these objects do not disturb the existence of other objects. In one embodiment of the present invention, there is no need to achieve all the objects. Objects other than the above objects will be apparent from and can be derived from the description of the specification and the like.

A display device of one embodiment of the present invention includes a self-luminous display element and a reflective display element. The reflective display element includes a light-reflective layer and a layer containing a liquid crystal material. The self-luminous display element transmits visible light. The layer containing the liquid crystal material includes a region located between the light-reflective layer and the self-luminous display element. A display device having such a structure can solve any of the above objects.

In the display device of one embodiment of the present invention which has the above structure, light emitted from the self-luminous display element is separated into light which does not pass through the layer containing the liquid crystal material and light which travels toward the layer containing the liquid crystal material, is reflected by the light-reflective layer, and returns to and passes through the self-luminous display element. Both light can be perceived by a user.

For example, a display device in which a self-luminous display element is formed between a substrate and a reflective display element is considered. The reflective display element is assumed to include a layer containing a liquid crystal material. Light emitted from the self-luminous display element passes through the reflective display element; therefore, the intensity of the perceived light depends on a viewing angle.

Meanwhile, of light emitted from the self-luminous display element of the display device of one embodiment of the present invention, light which does not pass through the layer containing the liquid crystal material can be perceived. The intensity of this light does not depend on a viewing angle. Display of the display device of one embodiment of the present invention does not depend on a viewing angle. In other words, high visibility can be achieved.

The display device including the layer containing the liquid crystal material includes a polarizing plate (also referred to as a polarizing filter). The polarizing plate, which is a component of the reflective display element, has a purpose of letting only light with a polarization component in a specific direction of light passing through the liquid crystal layer pass and be perceived as display light. The light transmittance of the polarizing plate is 50% or lower. In a structure where the self-luminous display element is formed between the polarizing plate and the layer containing the liquid crystal material, both of display light from the self-luminous display element and display light from the reflective display element pass through the polarizing plate.

In the above structure, the display device preferably includes a polarizing plate, and the polarizing plate preferably includes a region located between the layer containing the liquid crystal material and the self-luminous display element. In this structure, of light emitted from the self-luminous display element, light emitted from the self-luminous display element toward a user can avoid a decrease in light intensity due to passing through the polarizing plate. In other words, the power consumption of the self-luminous display element can be reduced and the reliability of the display element can be increased. Alternatively, the self-luminous display element preferably includes a region located between the layer containing the liquid crystal material and the polarizing plate. In the case where external light is reflected by a surface of a display device, the visibility of images of the display device is reduced; however, with this structure, the reduction can be prevented because the polarizing plate absorbs external light.

In each of the above structures, the display device preferably includes one coloring film or two or more coloring films, and the one coloring film or one of the two or more coloring films preferably includes at least a region located between the layer containing the liquid crystal material and the self-luminous display element. Alternatively, the self-luminous display element preferably includes at least a region located between the one coloring film or the one of the two or more coloring films and the layer containing the liquid crystal material. By providing the coloring film in a desired position, the color purity can be improved.

In each of the above structures, the display device preferably includes a supporting substrate, and the supporting substrate preferably includes at least a region located between the layer containing the liquid crystal material and the self-luminous display element. In that case, the process for manufacturing the display device can be simplified. Note that when the gap between the layer containing the liquid crystal material and the self-luminous display element is large, a parallax occurs; therefore, in the case where the supporting substrate is provided, the supporting substrate preferably has a thickness of greater than 0 mm and less than or equal to 0.7 mm.

In each of the above structures, it is preferable that the display device include a first transistor and a second transistor, the reflective display element include a first electrode and a second electrode, the first electrode and the second electrode can generate an electric field in the reflective display element and control alignment of the liquid crystal material of the layer containing the liquid crystal material, and the self-luminous display element include a third electrode.

In each of the above structures, it is preferable that a source electrode or a drain electrode of the first transistor be electrically connected to the first electrode, a source electrode or a drain electrode of the second transistor be electrically connected to the third electrode, the layer containing the liquid crystal material include a region located between a first gate insulating film and a second gate insulating film, and the third electrode include a region located between the layer containing the liquid crystal material and the second gate insulating film.

In each of the above structures, it is preferable that the first transistor and the second transistor each include a gate insulating film, the source electrode or the drain electrode of the first transistor be electrically connected to the first electrode, the source electrode or the drain electrode of the second transistor be electrically connected to the third electrode, and each of the gate insulating films include a region located between the layer containing the liquid crystal material and the third electrode.

In each of the above structures, the first transistor, the second transistor, the layer containing the liquid crystal material, and the self-luminous display element are preferably located between the polarizing plate and the light-reflective layer.

In each of the above structures, the display device preferably includes a first substrate and a second substrate. The first transistor, the second transistor, the layer containing the liquid crystal material, and the self-luminous display element are preferably located between the first substrate and the second substrate.

A semiconductor device of one embodiment of the present invention includes one or more of a keyboard, a hardware button, a pointing device, a touch sensor, an illuminance sensor, an imaging device, an audio input device, a viewpoint input device, and a pose detection device; and the above-described display device.

A display device with high visibility can be provided. A display device capable of a variety of display can be provided. A display device with low power consumption can be provided. A novel display device can be provided. A semiconductor device including the display device (display panel) can be provided. A novel semiconductor device can be provided.

BRIEF DESCRIPTION OF THE DRAWINGS

FIGS. 13A, 13B1, 13B2, and 13C illustrate a structure of an input/output panel which can be used in an input/output device in one embodiment.

DETAILED DESCRIPTION OF THE INVENTION

Figure 1A:
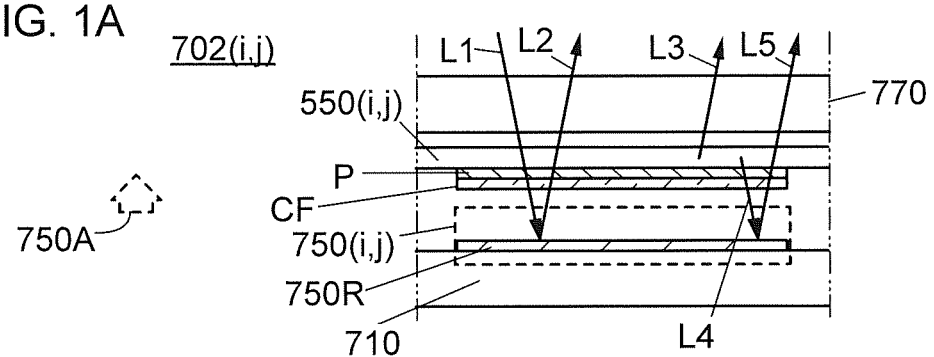
FIGS. 1A to 1D are each a simplified diagram of a pixel of a display device of one embodiment of the present invention.

Embodiments will be described in detail with reference to drawings. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first", "second", and the like are used in order to avoid confusion among components and do not limit the number.

(Embodiment 1)

In this embodiment, a display device of one embodiment of the present invention will be described with reference to FIGS. 1A to 1D.

A display device of one embodiment of the present invention includes a display panel. The display device of one embodiment of the present invention includes two or more substrates. The display panel described in this embodiment includes a pixel 702(i, j). Note that i and j each are an independent variable and an integer greater than or equal to 1. FIG. 1A is a simplified diagram of a structure and a light path of the pixel 702(i, j) of the display device of one embodiment of the present invention.

The pixel 702(i, j) includes a first display element 750(i, j) that is a reflective display element.

The pixel 702(i, j) further includes a second display element 550(i, j) that is a self-luminous display element. The second display element 550(i, j) transmits visible light.

The pixel 702(i, j) further includes a coloring film CF and a functional film P. In the display device of one embodiment of the present invention, the functional film P is a polarizing plate. Although the thickness of the polarizing plate is approximately 100 μm, for example, the drawings of this specification illustrate arrangement and do not show the thickness accurately. The pixel 702(i, j) further includes a light-reflective film 750R.

An example of light used for image display in the display device of one embodiment of the present invention is light L2 obtained in such a manner that light L1 that is external light is selected by the first display element 750(i, j) and the selected light is reflected by the light-reflective film 750R in the arrow 750A direction.

Another example of light used for image display in the display device of one embodiment of the present invention is light L3 that is emitted from the second display element 550(i, j) in the arrow 750A direction.

Another example of light used for image display in the display device of one embodiment of the present invention is light L5 obtained in such a manner that light L4 that is emitted from the second display element 550(i, j) is reflected by the light-reflective film 750R in the arrow 750A direction.

In the structure illustrated in FIG. 1A, the light L3 can be perceived without being transmitted through the functional film P and the first display element 750(i, j). In other words, a decrease in light intensity due to transmission through the functional film P and a decrease in viewing angle dependence of the light intensity due to transmission through the first display element 750(i, j) can be achieved.

In the structure illustrated in FIG. 1A, the first display element 750(i, j) and the second display element 550(i, j) are formed between the substrate 710 and the substrate 770. The functional film P is formed between the first display element 750(i, j) and the second display element 550(i, j).

Figure 1B:
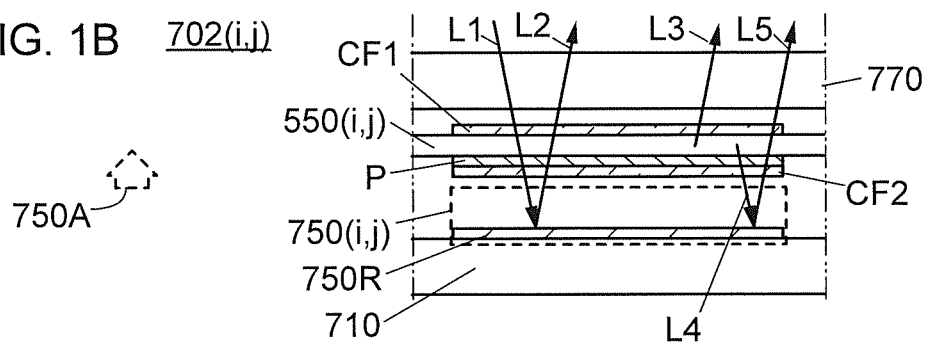

As illustrated in FIG. 1B, a plurality of coloring films, e.g., a coloring film CF1 and a coloring film CF2, may be provided. In this case, color display can be performed even using the light L3 and the light L4 which are emitted from the second display element 550(i, j) as white light. By using a plurality of coloring films, the color purity of desired light can be improved.

Figure 1C:
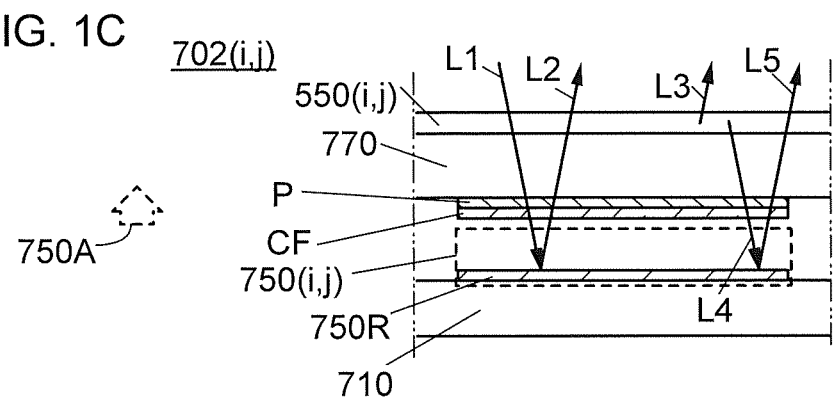

As illustrated in FIG. 1C, the substrate 770 may be provided between the first display element 750(i, j) and the second display element 550(i, j). In that case, the second display element 550(i, j) can be manufactured over the substrate 770 and a step of separating the second display element 550(i, j) and the substrate 770 which is performed later becomes unnecessary; thus, the yield can be improved. Note that when the substrate 770 has a large thickness, parallax of display is generated between the light L2 and the light L3 and between the light L2 and the light L5; therefore, the substrate 770 preferably has a small thickness, more preferably 0.7 mm or less.

Figure 1D:
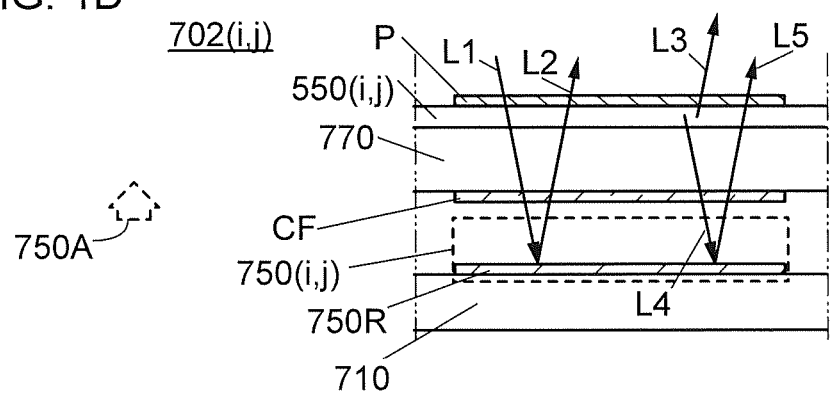

As illustrated in FIG. 1D, the second display element 550(i, j) may be arranged between the functional film P and the first display element 750(i, j). In this case, the thickness of the functional film P does not need to be considered in the manufacturing process, and a high degree of freedom for design, e.g., diversity of the functional film P to be used, can be achieved. As for the light L3, the light intensity is decreased owing to transmission through the functional film P, but viewing angle dependence of the light intensity due to transmission through the first display element 750(i, j) can be decreased.

The features of the structures of FIGS. 1A to 1D can be combined as appropriate.

The structure described in this embodiment can be combined with any of the structures described in the other embodiments as appropriate.

(Embodiment 2)

In this embodiment, a structure of a display device in which a reflective display element is formed over a substrate so that light is reflected in the direction in which the reflective display element is formed with respect to the substrate and a self-luminous display element is formed over the reflective display element will be described.

<Structure Example 1 of Display Device>

Figure 2A:
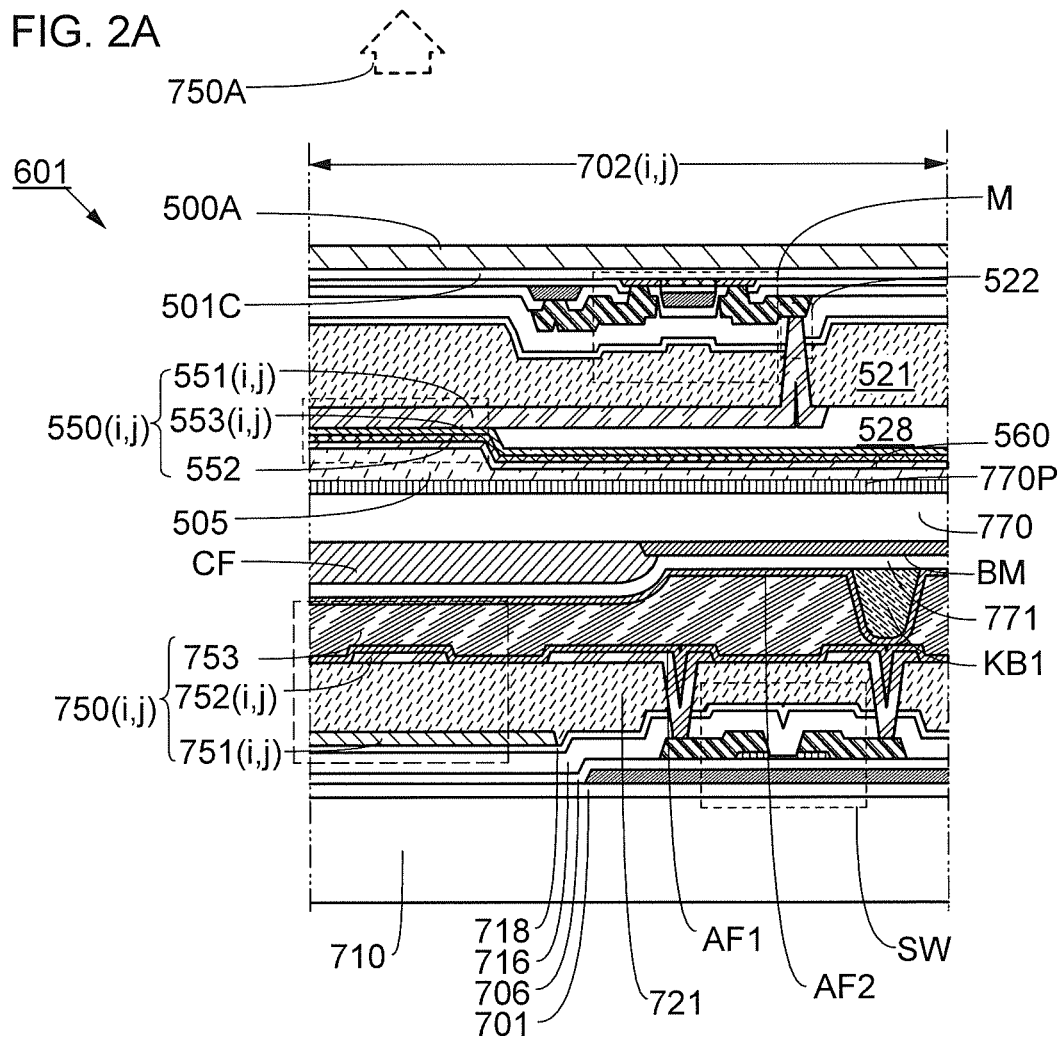
FIGS. 2A to 2C are cross-sectional views of a structure body included in a display device of one embodiment of the present invention.

A structure example of the pixel 702(i, j) that can be used for the display panel of one embodiment of the present invention will be described with reference to FIGS. 2A to 2C. FIG. 2A illustrates a structure body 601.

The pixel 702(i, j) in the display panel of one embodiment of the present invention includes the first display element 750(i, j) and the second display element 550(i, j).

The display panel of one embodiment of the present invention includes, in the pixel 702(i, j), a transistor SW, a transistor M, a first electrode 751(i, j), a second electrode 752(i, j), and a layer 753 containing a liquid crystal material. The second electrode 752(i, j) is positioned so that an electric field that controls the alignment of the liquid crystal material is generated between the second electrode 752(i, j) and the first electrode 751(i, j). In FIG. 2A, the first electrode 751(i, j) and the second electrode 752(i, j) are provided to enable display in a fringe field switching (FFS) mode. In FIG. 2A, the first electrode 751(i, j), the second electrode 752(i, j), and the layer 753 containing the liquid crystal material, which are surrounded by a dotted line, almost correspond to a display region of the first display element 750(i, j).

The display panel of one embodiment of the present invention includes the coloring film CF, a light-blocking film BM, a functional film 770P, an alignment film AF1, and an alignment film AF2.

The display panel of one embodiment of the present invention includes an insulating film 771, an insulating film 721, an insulating film 718, an insulating film 716, an insulating film 701, a structure body KB1, and an insulating film 706.

The display panel of one embodiment of the present invention includes the substrate 710 or the substrate 770.

A gate electrode and a first electrode of the transistor SW are electrically connected to a scan line and a signal line, respectively.

Figure 2B:
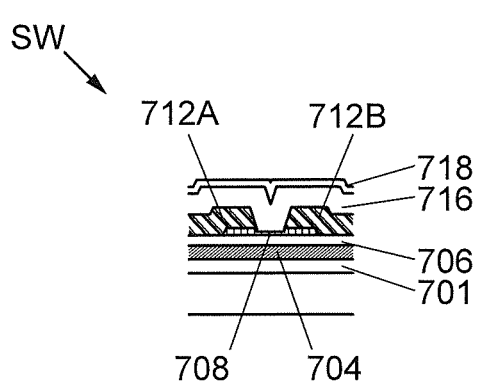

A transistor including a semiconductor film 708, a conductive film 704, the insulating film 706, a conductive film 712A, and a conductive film 712B can be used as the transistor SW (see FIG. 2B). The conductive film 704 includes a region overlapping with the semiconductor film 708, and the conductive film 712A and the conductive film 712B are electrically connected to the semiconductor film 708. The insulating film 706 includes a region located between the semiconductor film 708 and the conductive film 704.

Note that the conductive film 704 and the insulating film 706 function as a gate electrode and a gate insulating film, respectively. The conductive film 712A functions as one of a source electrode and a drain electrode, and the conductive film 712B functions as the other of the source electrode and the drain electrode.

The coloring film CF has a region overlapping with the first display element 750(i, j).

The light-blocking film BM has an opening in a region overlapping with the first display element 750(i, j).

The insulating film 771 includes a region located between the layer 753 containing the liquid crystal material and the light-blocking film BM or a region located between the layer 753 containing the liquid crystal material and the coloring film CF.

The functional film 770P is provided so that the first display element 750(i, j) lies between the functional film 770P and the substrate 710.

The substrate 770 includes a region overlapping with the substrate 710 and is provided so that the first display element 750(i, j) lies between the substrate 770 and the substrate 710.

The insulating film 721 includes a region located between the layer 753 containing the liquid crystal material and the transistor SW. The insulating film 718 includes a region located between the insulating film 721 and the transistor SW. The insulating film 716 includes a region located between the insulating film 718 and the transistor SW. The insulating film 701 includes a region located between the transistor SW and the substrate 710. The insulating film 706 includes a region located between the insulating film 716 and the insulating film 701.

The display panel of one embodiment of the present invention includes a bonding layer 505. The bonding layer 505 includes a region located between the second display element 550(i, j) and the substrate 770 and has a function of bonding the second display element 550(i, j) to the substrate 770.

The display panel of one embodiment of the present invention includes an insulating layer 501C, an insulating layer 521, an insulating film 528, an insulating layer 518, and an insulating layer 516. A resin layer 500A is provided over the insulating layer 501C.

The display panel of one embodiment of the present invention includes a transistor M including a semiconductor film 508, a conductive film 504, a conductive layer 512A, and a conductive layer 512B. The insulating layer 506 includes a region located between the semiconductor film 508 and the conductive film 504. The semiconductor film 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The second display element 550(i, j) in the display panel of one embodiment of the present invention includes a third electrode 551(i, j). In a connection portion 522, the third electrode 551(i, j) is electrically connected to the conductive layer 512B of the transistor M and electrically connects a fourth electrode 552 of the second display element 550(i, j) and a wiring through which a common potential is supplied. A layer 553(i, j) containing an organic compound is provided between the third electrode 551(i, j) and the fourth electrode 552. In FIG. 2A, the third electrode 551(i, j), the fourth electrode 552, and the layer 553(i, j) containing the organic compound sandwiched therebetween, which are surrounded by a dotted line, almost correspond to a display region of the second display element 550(i, j).

This enables the second display element 550(*i, j*) to be driven. A protective layer 560 is provided between the functional film 770P and the bonding layer 505.

<Reflective Display Element>

The details of components of the first display element 750(*i, j*) will be described below. The first display element 750(*i, j*) is a reflective display element.

<Wiring, Conductive Film>

A conductive material can be used for a wiring or the like. A light-transmitting conductive material can be used for a wiring on a path through which the light L1 and the light L4 are transmitted in FIGS. 1A to 1D.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is preferably used in microfabrication using a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

A light-transmitting material, specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film including graphene oxide is formed and is subjected to reduction, so that a film including graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conductive high molecular compound can be used for the wiring or the like.

<Transistor SW>

For example, a bottom-gate or top-gate transistor can be used as the transistor SW and the like.

For example, a transistor including a semiconductor containing an element belonging to Group 14 in a semiconductor film can be used. Specifically, a semiconductor containing silicon can be used for the semiconductor film. For example, single crystal silicon, polysilicon, microcrystalline silicon, amorphous silicon, or the like can be used for the semiconductor film of the transistor.

For example, a transistor using a metal oxide for a semiconductor film can be used. Specifically, a metal oxide containing indium or a metal oxide containing indium, gallium, and zinc can be used for a semiconductor film.

For example, a transistor having a lower leakage current in an off state than a transistor that uses amorphous silicon for a semiconductor film can be used as the transistor SW and the like. Specifically, a transistor using a metal oxide for the semiconductor film 708 can be used as the transistor SW and the like.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the display device can be reduced, and power consumption for driving can be reduced.

For example, a transistor including the semiconductor film 708, the conductive film 704, the insulating film 706, the conductive film 712A, and the conductive film 712B can be used as the transistor SW or the like. The conductive film 704 includes a region overlapping with the semiconductor film 708, and the conductive film 712A and the conductive film 712B are electrically connected to the semiconductor film 708. The insulating film 706 includes a region located between the semiconductor film 708 and the conductive film 704.

Note that the conductive film 704 and the insulating film 706 serve as a gate electrode and a gate insulating film, respectively. The conductive film 712A serves as one of a source electrode and a drain electrode, and the conductive film 712B serves as the other of the source electrode and the drain electrode.

A conductive film formed by stacking a 10-nm-thick film containing tantalum and nitrogen and a 300-nm-thick film containing copper in this order can be used as the conductive film 704, for example.

For example, a material obtained by stacking a 400-nm-thick film containing silicon and nitrogen and a 200-nm-thick film containing silicon, oxygen, and nitrogen can be used for the insulating film 706.

For example, a 25-nm-thick film containing indium, gallium, and zinc can be used as the semiconductor film 708.

For example, a conductive film formed by stacking a 50-nm-thick film containing tungsten, a 400-nm-thick film containing aluminum, and a 100-nm-thick film containing titanium in this order can be used as the conductive film 712A or the conductive film 712B.

<First Display Element 750(*i, j*)>

For example, a display element having a function of controlling transmission or reflection of light can be used as the first display element 750(*i, j*) or the like. For example, a combined structure of a polarizing plate and a liquid crystal element can be used.

For example, a liquid crystal element that can be driven by any of the following driving methods can be used: an in-plane switching (IPS) mode, a twisted nematic (TN) mode, an FFS mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 750(*i, j*) includes the first electrode 751(*i, j*), the second electrode 752(*i, j*), and the layer 753 containing the liquid crystal material. The layer 753 contains the liquid crystal material whose alignment is controlled by voltage applied between the first electrode

751(*i, j*) and the second electrode 752(*i, j*). For example, the alignment of the liquid crystal material can be controlled by an electric field in the thickness direction of the layer containing the liquid crystal material (also referred to as the vertical direction) or an electric field in the direction intersecting with the vertical direction (also referred to as the horizontal direction or the diagonal direction).

<Layer 753 Containing Liquid Crystal Material>

For example, thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

<First Electrode 751(*i, j*), Second Electrode 752(*i, j*)>

In the case where the first electrode 751(*i, j*) and the second electrode 752(*i, j*) are arranged as illustrated in FIG. 2A, a conductive material with a light-reflecting property can be used for each of the electrodes.

The display panel also includes the alignment film AF1, the alignment film AF2, the coloring film CF1, the coloring film CF2, the light-blocking film BM, the insulating film 771, and the functional film 770P.

In the case where the first display element 750(*i, j*) has a vertical alignment (VA) mode, the second electrode 752(*i, j*) is formed so that the alignment film AF2 is positioned between the second electrode 752(*i, j*) and the layer 753 containing the liquid crystal material. In that case, a conductive material with a light-transmitting property can be used for the second electrode 752(*i, j*). With such an electrode, light can be reflected in the arrow 750A direction.

<Coloring Film CF>

A material transmitting light of a predetermined color can be used for the coloring film CF. Thus, the coloring film CF can be used as, for example, a color filter. For example, the coloring film CF can be formed using a material transmitting light of blue, green, red, yellow, or white.

<Light-blocking Film BM>

The light-blocking film BM can be formed with a material that prevents light transmission and can thus be used as a black matrix, for example.

<Insulating Film 771>

The insulating film 771 can be formed using polyimide, an epoxy resin, an acrylic resin, or the like.

<Functional Film 770P>

The functional film 770P is a polarizing film. In addition to this, a stacked film of an anti-reflection film, a retardation film, a light diffusion film, a condensing film, or the like may be used as the functional film 770P, for example.

For example, a stacked film of a polarizing film and an antistatic film preventing the attachment of a foreign substance, a water repellent film suppressing the attachment of stain, a hard coat film suppressing a scratch due to use, or the like can be used as the functional film 770P.

<Substrate 710, Substrate 770>

A material having heat resistance high enough to withstand heat treatment in the manufacturing process can be used for the substrate 710 or 770 or the like. A material with a thickness of greater than or equal to 0.1 mm and less than or equal to 0.7 mm can be used for the substrate 710 or 770. Specifically, a material polished to a thickness of approximately 0.1 mm can be used.

For example, a large-sized glass substrate having any of the following sizes can be used as the substrate 710 or 770 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 710 or 770 or the like, an organic material, an inorganic material, a composite material of an organic material and an inorganic material, or the like can be used. For example, an inorganic material such as glass, ceramic, or metal can be used for the substrate 710 or 770 or the like.

Specifically, non-alkali glass, soda-lime glass, potash glass, crystal glass, aluminosilicate glass, tempered glass, chemically tempered glass, quartz, sapphire, or the like can be used for the substrate 710 or 770 or the like. Specifically, an inorganic oxide film, an inorganic nitride film, an inorganic oxynitride film, or the like can be used for the substrate 710 or 770 or the like. For example, a silicon oxide film, a silicon nitride film, a silicon oxynitride film, an aluminum oxide film, or the like can be used for the substrate 710 or 770 or the like. Stainless steel, aluminum, or the like can be used for the substrate 710 or 770 or the like.

For example, a single crystal semiconductor substrate or a polycrystalline semiconductor substrate of silicon or silicon carbide, a compound semiconductor substrate of silicon gel or the like, an SOI substrate, or the like can be used as the substrate 710 or 770 or the like. Thus, a semiconductor element can be provided over the substrate 710 or 770 or the like.

For example, an organic material such as a resin, a resin film, or plastic can be used for the substrate 710 or 770 or the like. Specifically, a resin film or a resin plate of polyester, polyolefin, polyamide, polyimide, polycarbonate, an acrylic resin, or the like can be used for the substrate 710 or 770 or the like.

For example, a composite material formed by attaching a metal plate, a thin glass plate, or a film of an inorganic material to a resin film or the like can be used for the substrate 710 or 770 or the like. For example, a composite material formed by dispersing a fibrous or particulate metal, glass, an inorganic material, or the like into a resin film can be used for the substrate 710 or 770 or the like. For example, a composite material formed by dispersing a fibrous or particulate resin, an organic material, or the like into an inorganic material can be used for the substrate 710 or 770 or the like.

Furthermore, a single-layer material or a layered material in which a plurality of layers are stacked can be used for the substrate 710 or 770 or the like. For example, a layered material in which a substrate, an insulating film that prevents diffusion of impurities contained in the substrate, and the like are stacked can be used for the substrate 710 or 770 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 710 or 770 or the like. Alternatively, a layered material in which a resin and a film for preventing diffusion of impurities that penetrate the resin, such as a silicon oxide film, a silicon nitride film, or a silicon oxynitride film, are stacked can be used for the substrate 710 or 770 or the like.

Specifically, a resin film, a resin plate, a layered material, or the like of polyester, polyolefin, polyamide, polyimide, polycarbonate, an acrylic resin, or the like can be used for the substrate 710 or 770 or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone, can be used for the substrate 710 or 770 or the like Specifically, polyethylene terephthalate (PET), polyethylene naphthalate (PEN), polyethersulfone (PES), acrylic, or the like can be used for the substrate 710 or 770 or the like.

Alternatively, paper, wood, or the like can be used for the substrate 710 or 770 or the like.

For example, a flexible substrate can be used as the substrate 710 or 770 or the like.

Note that a transistor, a capacitor, or the like can be directly formed on the substrate. Alternatively, a transistor, a capacitor, or the like can be formed on a substrate which is for use in the manufacturing process and can withstand heat applied in the manufacturing process, and then the transistor, the capacitor, or the like can be transferred to the substrate 710 or 770 or the like. Thus, a transistor, a capacitor, or the like can be formed over a flexible substrate, for example.

<Insulating Film 721>

For example, an insulating inorganic material, an insulating organic material, or an insulating composite material containing an inorganic material and an organic material can be used for the insulating film 721 or the like.

Specifically, an inorganic oxide film, an inorganic nitride film, an inorganic oxynitride film, or a layered material obtained by stacking some of these films can be used as the insulating film 721 or the like. For example, a film including any of a silicon oxide film, a silicon nitride film, a silicon oxynitride film, an aluminum oxide film, and the like, or a film including a layered material obtained by stacking some of these films can be used as the insulating film 721 or the like.

Specifically, for the insulating film 721 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating film 721, for example, can be reduced.

<Insulating Film 701>

For example, any of the materials that can be used for the insulating film 721 can be used for the insulating film 701. Specifically, a material containing silicon and oxygen can be used for the insulating film 701. Thus, diffusion of impurities into the transistor SW or the transistor M can be suppressed.

<Backlight>

Although not illustrated, a backlight or a front light may be provided. As a backlight, an underneath type or a sidelight type can be used. As a light source, a cold cathode tube or a light-emitting diode (LED) can be used. As an LED, a white LED or a combination of LEDs of respective colors (e.g., white, red, blue, green, cyan, magenta, and/or yellow) may be used. By using an LED, a peak of a wavelength of light is sharp, so that color purity can be improved. In the case of a sidelight type, a light guide plate is provided and a uniform surface light source is realized. The liquid crystal display device is formed in this manner.

<Self-luminous Display Element>

Components of the second display element 550(i, j) will be described below in details. The second display element 550(i, j) is a self-luminous display element.

<Resin Layer 500A>

The resin layer 500A serves as a protective layer for the self-luminous display element and is a portion to be separated in a process of manufacturing the self-luminous display element. A photosensitive resin can be used as a material of the resin layer 500A. The details will be described later.

<Display Element 550(i, j)>

The second display element 550(i, j) includes the third electrode 551(i, j), the fourth electrode 552, and the layer 553(i, j) containing the organic compound. According to one embodiment of the present invention, the second display element 550(i, j) is also referred to as a light-emitting element. The layer 553(i, j) containing an organic compound will be described later in details.

The third electrode 551(i, j) and the fourth electrode 552 can be formed using a material that transmits visible light. Specifically, a conductive oxide, such as indium oxide, indium tin oxide, indium zinc oxide, zinc oxide, or zinc oxide to which gallium is added, can be used for the wiring or the like.

When a semi-transmissive layer with a light reflectance of 30% or higher and a light transmittance of 50% or higher in a wavelength range of greater than or equal to 400 nm and less than or equal to 700 nm is formed as each of the third electrode 551(i, j) and the fourth electrode 552, light emitted from the layer 553(i, j) containing the organic compound resonates by multiple reflection, that is, a function as a so-called micro optical resonator (microcavity) may be provided. Although described later, the function as the microcavity may be obtained in such a manner that an electrode like the second electrode 752(i, j) of the reflective display element has semi-transmissivity and resonance is performed by multiple reflection.

<Bonding Layer 505>

As the bonding layer 505, various curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

<Insulating Layer 521>

For example, an insulating inorganic material, an insulating organic material, or an insulating composite material containing an inorganic material and an organic material can be used for the insulating layer 521 or the like.

Specifically, an inorganic oxide film, an inorganic nitride film, an inorganic oxynitride film, or a layered material obtained by stacking some of these films can be used as the insulating layer 521 or the like. For example, a film including any of a silicon oxide film, a silicon nitride film, a silicon oxynitride film, an aluminum oxide film, and the like, or a film including a layered material obtained by stacking some of these films can be used as the insulating layer 521 or the like.

Specifically, for the insulating layer 521 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating layer 521, for example, can be reduced.

<Insulating Film 528>

For example, any of the materials that can be used for the insulating layer 521 can be used for the insulating film 528 or the like. Specifically, a 1-µm-thick polyimide-containing film can be used as the insulating film 528.

<Insulating Layer 501C>

For example, any of the materials that can be used for the insulating layer 521 can be used for the insulating layer 501C. Specifically, a material containing silicon and oxygen can be used for the insulating layer 501C. Thus, diffusion of impurities into the pixel circuit, the second display element, or the like can be suppressed.

For example, a 200-nm-thick film containing silicon, oxygen, and nitrogen can be used for the insulating layer 501C.

<Transistor M>

The transistor M can be formed using the same material as the transistor SW. A first electrode and a second electrode of the second display element 550 are electrically connected to a second electrode of the transistor M and a wiring through which a common potential is supplied, respectively. This enables the second display element 550 to be driven.

<Driver Circuit SD>

Although not illustrated, the driver circuit SD is configured to generate an image signal supplied to the pixel circuit in accordance with image data, for example. Specifically, the driver circuit SD has a function of generating a signal whose polarity is inverted. Thus, the first display element 750(i, j) and the second display element 550(i, j) can be driven.

For example, any of sequential circuits such as a shift register that drives the first display element 750(i, j) and the second display element 550(i, j) can be used as the driver circuit SD.

For example, an integrated circuit can be used as the driver circuit SD. Specifically, an integrated circuit formed over a silicon substrate can be used as the driver circuit SD.

For example, the driver circuit SD can be mounted on a terminal by a chip on glass (COG) method. Specifically, an anisotropic conductive film can be used to mount an integrated circuit on the terminal. Alternatively, a chip on film (COF) method may be used to mount an integrated circuit on the terminal.

The structure described in this embodiment can be combined with any of the structures described in the other embodiments as appropriate.

(Embodiment 3)

In this embodiment, a method for manufacturing a display device in which a reflective display element is formed over a substrate so that light is reflected in the direction in which the reflective display element is formed with respect to the substrate and a self-luminous display element is formed over the reflective display element will be described. In this embodiment, a method for manufacturing the display device illustrated in FIGS. 2A to 2C, which is one embodiment of the present invention, will be described.

Figure 3A:
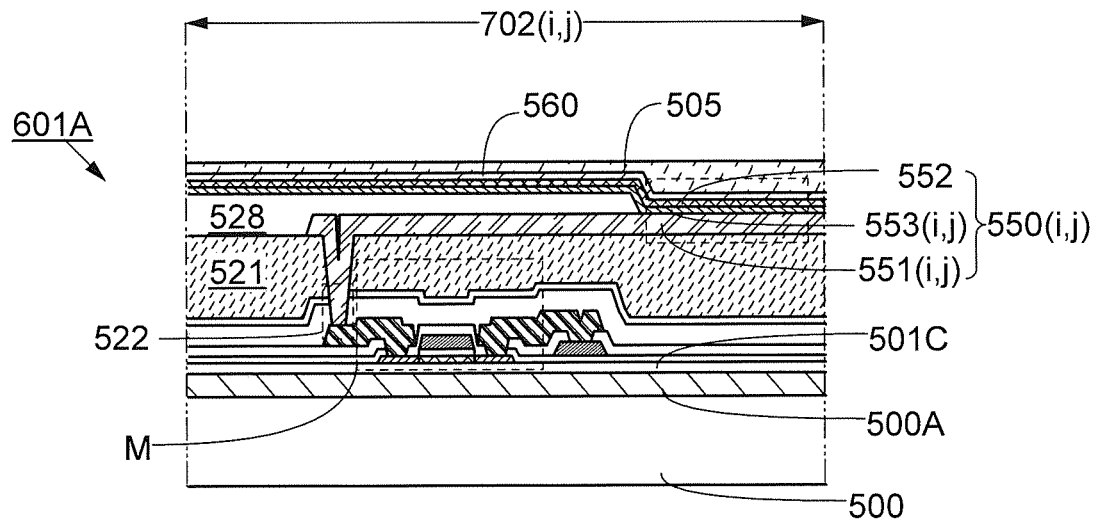
FIGS. 3A to 3C are each a cross-sectional view of a structure body included in a display device of one embodiment of the present invention.
Figure 3B:
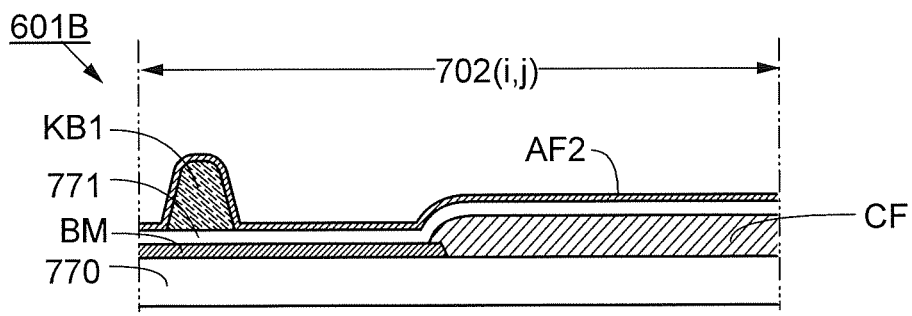
Figure 3C:
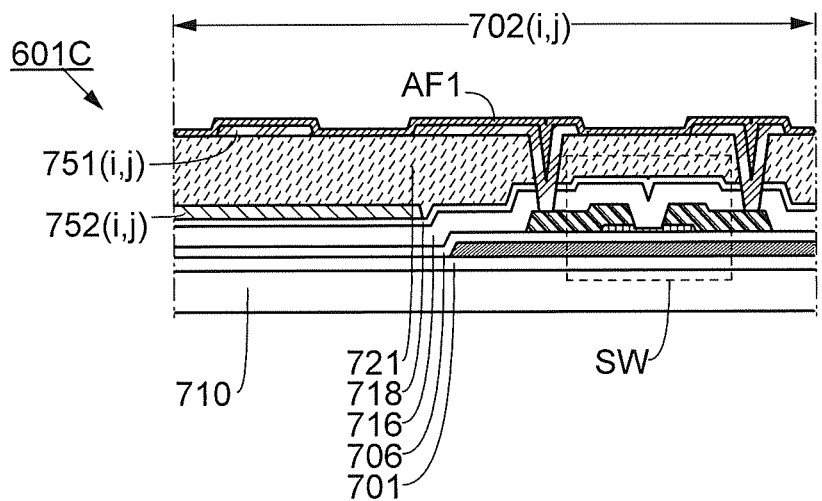

FIG. 3A illustrates a structure body 601A in which a self-luminous display element is provided over a substrate 500. FIG. 3B illustrates a structure body 601B including the coloring film CF, the structure body KB1, the light-blocking film BM, and the insulating film 771 over the substrate 770. FIG. 3C illustrates a structure body 601C in which a circuit for driving a reflective display element is formed over the substrate 710.

In the structure body 601B illustrated in FIG. 3B, an organic resin film such as an acrylic resin film is patterned before the alignment film AF2 is formed; thus, the columnar structure body KB1 for keeping the distance between substrates is formed in a desired position.

After the structure bodies 601A to 601C are obtained, the structure body 601B and the structure body 601C are bonded with a sealant to face each other. A space between the structure body 601B, the structure body 601C, and the sealant is filled with a liquid crystal material.

Figure 4A:
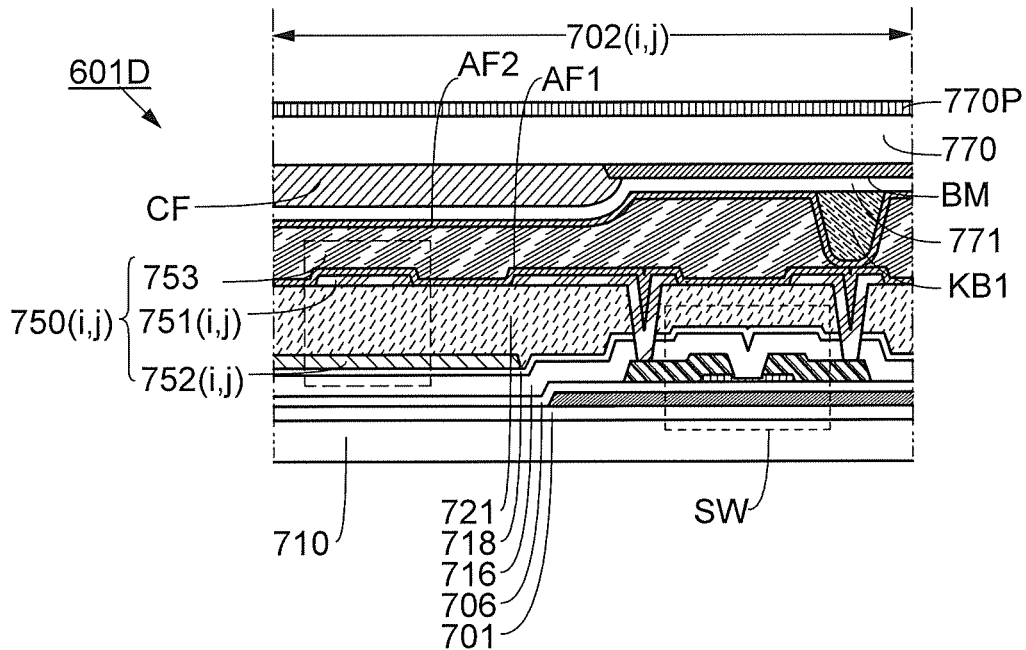
FIGS. 4A and 4B are each a cross-sectional view of a structure body included in a display device of one embodiment of the present invention.
Figure 4B:
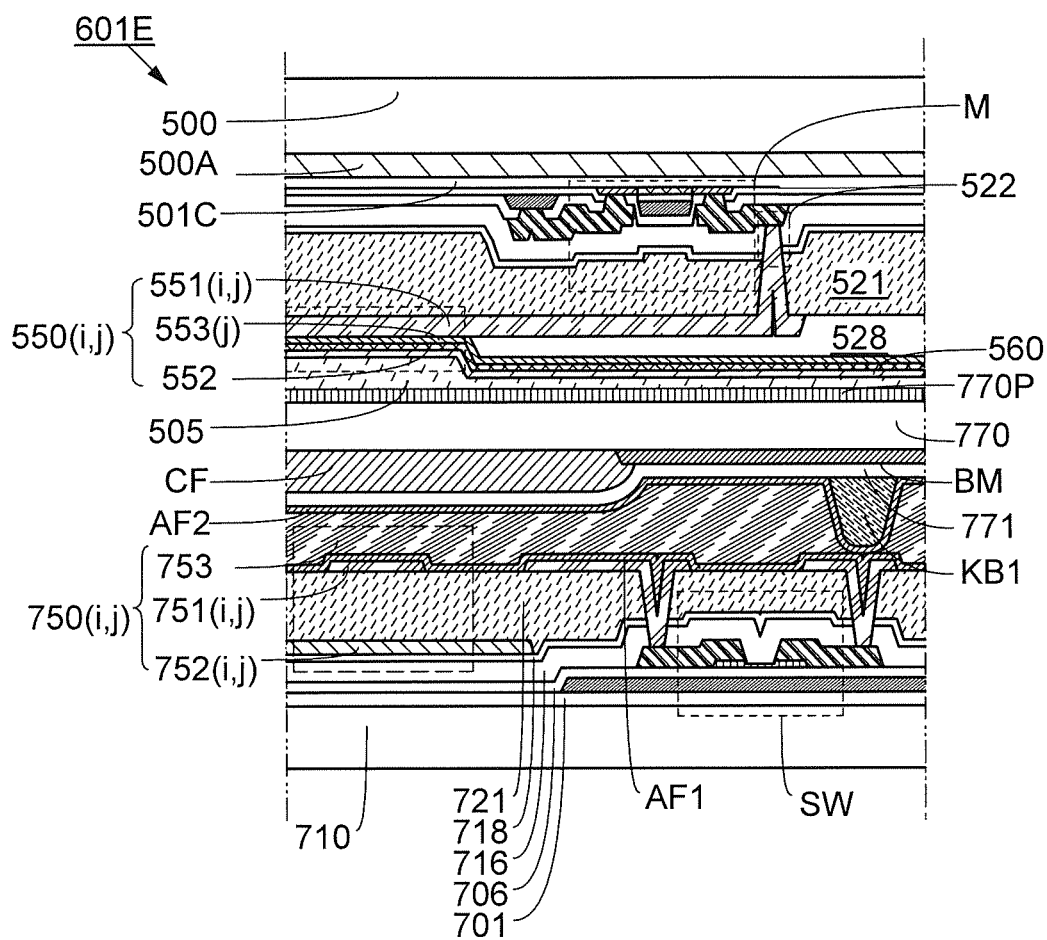

A structure body 601D including a reflective display element is formed in such a manner that after the structure body 601B and the structure body 601C are bonded and the space therebetween is filled with the liquid crystal material as described above, the functional film 770P is formed on the structure body 601B side (see FIG. 4A). Next, the structure body 601A is bonded to the structure body 601D. As a result, a structure body 601E illustrated in FIG. 4B is formed.

A method for manufacturing the structure body 601A, a method for bonding the structure body 601A and the structure body 601D to each other, and a method for separating the substrate 500 from the structure body 601E will be described below.

<Method for Manufacturing Structure Body 601A>

Although described later, the structure body 601A is divided (separated) into the substrate 500 and a structure manufactured thereover. In that case, the resin layer 500A in the structure body 601A is irradiated with light using a laser. The display device of one embodiment of the present invention preferably includes a metal oxide in a channel formation region of the transistor M. This is because the transistor M can be formed at a temperature lower than or equal to the allowable temperature limit of the resin layer 500A.

In the case where low temperature polysilicon (LTPS) is used for a channel formation region of a transistor, the resin layer is required to have heat resistance because heat at a temperature of approximately 500° C. to 550° C. needs to be applied. Furthermore, the resin layer needs to have a large thickness so that damage in a step of laser crystallization is reduced.

In contrast, a transistor including a metal oxide is formed at a temperature lower than or equal to 350° C., or even lower than or equal to 300° C. Therefore, the resin layer is not required to have high heat resistance. Accordingly, the heat resistant temperature of the resin layer can be low, and the range of choices for the materials can be widened. Furthermore, the transistor including a metal oxide does not need a laser crystallization step; thus, the resin layer can be thin. Since the resin layer is not required to have high heat resistance and can be thinned, the manufacturing cost of a device can be significantly reduced. A metal oxide is preferably used, in which case the steps can be simplified as compared with the case where LTPS is used.

A conductive layer overlapping with a bottom surface of a recessed portion of a resin layer through an insulating layer can be formed using the same material and the same steps as an electrode or a metal oxide of a transistor.

For example, conductive materials such as a metal, an alloy, and an oxide conductive layer used for an electrode of a transistor can be used for the conductive layer.

Alternatively, for example, a metal oxide layer used as the conductive layer and a metal oxide layer used as the semiconductor layer of the transistor are formed using the same material and the same steps. After that, the resistance of only the metal oxide layer used as the conductive layer is reduced (it can also be said that an oxide conductive layer is formed).

Alternatively, for example, a metal oxide layer used as the conductive layer and a metal oxide layer used as the electrode (e.g., a gate electrode) of the transistor are formed using the same material and the same steps. After that, the resistance of the metal oxide layer used as the conductive layer and the resistance of the metal oxide layer used as the electrode of the transistor are reduced.

The metal oxide is a semiconductor material whose resistance can be controlled by oxygen vacancies in the film of the semiconductor material and/or the concentration of impurities (typically, hydrogen, water, or the like) in the film of the semiconductor material. Thus, the resistivity of the metal oxide layer can be controlled by selecting treatment for increasing oxygen vacancies and/or impurity concentration in the metal oxide layer or treatment for reducing oxygen vacancies and/or impurity concentration in the metal oxide layer.

Specifically, the resistivity of the metal oxide can be controlled by plasma treatment. For example, plasma treatment using a gas containing one or more kinds selected from a rare gas (He, Ne, Ar, Kr, or Xe), hydrogen, boron, phosphorus, and nitrogen can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the metal oxide layer can have a high carrier density and a low resistivity.

Hydrogen, boron, phosphorus, or nitrogen is injected into the metal oxide layer by an ion implantation method, an ion doping method, a plasma immersion ion implantation method, or the like, so that the resistivity of the metal oxide layer can be reduced.

Alternatively, a method in which a film containing hydrogen and/or nitrogen is formed in contact with the metal oxide layer and hydrogen and/or nitrogen are/is diffused from the film into the metal oxide layer can be employed. Thus, the metal oxide layer can have a high carrier density and a low resistivity.

Hydrogen contained in the metal oxide layer reacts with oxygen bonded to a metal atom to be water, and also causes oxygen vacancies in a lattice from which oxygen is released (or a portion from which oxygen is released). Entry of hydrogen into the oxygen vacancies generates an electron serving as a carrier in some cases. Furthermore, in some cases, bonding of part of hydrogen to oxygen bonded to a metal atom causes generation of an electron serving as a carrier. Thus, the metal oxide layer can have a high carrier density and a low resistivity.

In the case where heat treatment is performed in the manufacturing process of the display device, oxygen is released from the metal oxide layer by heating the metal oxide layer, so that oxygen vacancies might be increased. Thus, the resistivity of the metal oxide layer can be reduced.

Note that such an oxide conductor layer formed using a metal oxide layer can be referred to as a metal oxide layer having a high carrier density and a low resistivity, a metal oxide layer having conductivity, or a metal oxide layer having high conductivity.

The resin layer 500A in the display device of one embodiment of the present invention has a thickness of greater than or equal to 0.1 μm and less than or equal to 3 μm. By forming the resin layer thin, the display device can be manufactured at low cost. The display device can be light-weight and thin. The display device can have higher flexibility.

According to one embodiment of the present invention, a transistor or the like is formed at a temperature of lower than or equal to the allowable temperature limit of the resin layer. The heat resistance of the resin layer can be measured by, for example, a weight loss percentage due to heat, specifically, the 5% weight loss temperature. According to one embodiment of the present invention, the 5% weight loss temperature of the resin layer is preferably lower than or equal to 450° C., further preferably lower than or equal to 400° C., still further preferably lower than 400° C., yet still further preferably lower than 350° C.

According to one embodiment of the present invention, irradiation with a linear laser beam is performed. A laser apparatus used in a manufacturing line for LTPS or the like can be effectively used. A linear laser beam is condensed in a long rectangular shape (is shaped into a linear laser beam) so that the resin layer is irradiated with light.

[Manufacturing Method Example 1]

First, the resin layer 500A is formed using a photosensitive material over the substrate 500.

In particular, a photosensitive and thermosetting material is preferably used. In this embodiment, a photosensitive and thermosetting material is used.

Specifically, a material is deposited and then the film is heated, so that the resin layer 500A is formed.

By the heat treatment, released gas components (e.g., hydrogen or water) in the resin layer 500A can be reduced. In particular, the heat treatment is preferably performed at a temperature higher than the fabricating temperature of each layer formed over the resin layer 500A. For example, in the case where the manufacturing temperature of the transistor is below 350° C., a film to be the resin layer 500A is preferably heated at a temperature higher than 350° C. and lower than or equal to 450° C., further preferably lower than or equal to 400° C., still further preferably lower than or equal to 375° C. Thus, a gas released from the resin layer 500A in the manufacturing process of the transistor can be significantly reduced.

The resin layer 500A has flexibility. The substrate 500 has lower flexibility than the resin layer 500A.

The resin layer 500A is preferably formed using a photosensitive polyimide resin (also referred to as a PSPI).

Examples of photosensitive materials which can be used to form the resin layer 500A include an acrylic resin, an epoxy resin, a polyamide resin, a polyimide-amide resin, a siloxane resin, a benzocyclobutene-based resin, and a phenol resin.

The resin layer 500A is preferably formed using a spin coater. By a spin coating method, a thin film can be uniformly formed over a large-sized substrate.

The resin layer 500A is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. As the viscosity of the solution is lower, application is performed more easily. As the viscosity of the solution is lower, inclusion of air bubbles can be reduced more; thus, a high-quality film can be formed.

The resin layer 500A preferably has a thickness of greater than or equal to 0.01 μm and less than 10 μm, further preferably greater than or equal to 0.1 μm and less than or equal to 3 μm, still further preferably greater than or equal to 0.5 μm and less than or equal to 1 μm. With a solution having low viscosity, the resin layer 500A having a small thickness can be easily faulted. When the resin layer 500A has a thickness in the above range, the display device can have higher flexibility. Without limitation thereto, the thickness of the resin layer 500A may be greater than or equal to 10 μm. For example, the resin layer 500A may have a thickness of greater than or equal to 10 μm and less than or equal to 200 μm. The resin layer 500A preferably has a thickness of greater than or equal to 10 μm because the rigidity of the display device can be increased.

The resin layer 500A can be formed by dip coating, spray coating, ink jetting, dispensing, screen printing, or offset printing, with a doctor knife, a slit coater, a roll coater, a curtain coater, or a knife coater.

The resin layer 500A preferably has a thermal expansion coefficient of greater than or equal to 0.1 ppm/° C. and less than or equal to 20 ppm/° C., further preferably greater than or equal to 0.1 ppm/° C. and less than or equal to 10 ppm/° C. As the resin layer 500A has a lower thermal expansion coefficient, generation of a crack in a layer included in a transistor or the like and breakage of a transistor or the like which are caused owing to the heat treatment can be further prevented.

In the case where the resin layer 500A is positioned on the display surface side of the display device, the resin layer 500A preferably has a high visible-light transmitting property.

The substrate 500 has stiffness high enough for easy transfer and has resistance to heat applied in the manufacturing process. Examples of a material that can be used for the substrate 500 include glass, quartz, ceramics, sapphire, a resin, a semiconductor, a metal, and an alloy. Examples of the glass include alkali-free glass, barium borosilicate glass, and aluminoborosilicate glass.

Next, the insulating layer 501C is formed over the resin layer 500A.

The insulating layer 501C is formed at a temperature lower than or equal to the allowable temperature limit of the resin layer 500A. The insulating layer 501C is preferably formed at a temperature lower than heating temperature in the above-described heat treatment (postbake treatment).

The insulating layer 501C can be used as a barrier layer that prevents diffusion of impurities contained in the resin layer 500A into a transistor and a display element formed later. For example, the insulating layer 501C preferably prevents moisture and the like contained in the resin layer 500A from diffusing into the transistor and the display element when the resin layer 500A is heated. Thus, the insulating layer 501C preferably has a high barrier property.

As the insulating layer 501C, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 500A and a silicon oxide film be formed over the silicon nitride film.

An inorganic insulating film is preferably formed at high temperatures because the film can have higher density and a higher barrier property as the deposition temperature becomes higher.

The substrate temperature during the deposition of the insulating layer 501C is preferably higher than or equal to room temperature (25° C.) and lower than or equal to 350° C., further preferably higher than or equal to 100° C. and lower than or equal to 300° C.

Next, the transistor M is formed over the insulating layer 501C.

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a top-gate transistor including the semiconductor film 508 is formed as the transistor M is described.

According to one embodiment of the present invention, a metal oxide is used as a semiconductor of a transistor. A semiconductor material having a wider bandgap and a lower carrier density than silicon is preferably used because off-state current of the transistor can be reduced.

The transistor M is formed at a temperature lower than or equal to the allowable temperature limit of the resin layer 500A. The transistor M is preferably formed at a temperature lower than the heating temperature in the above-described postbake treatment.

The substrate temperature in a step of forming the conductive film is preferably higher than or equal to room temperature and lower than or equal to 350° C., further preferably higher than or equal to room temperature and lower than or equal to 300° C.

The conductive films included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO containing gallium, or indium tin oxide containing silicon may be used. Alternatively, a semiconductor such as a metal oxide or polycrystalline silicon whose resistance is lowered by containing an impurity element, for example, or silicide such as nickel silicide may be used. A film including graphene may be used as well. The film including graphene can be formed, for example, by reducing a film containing graphene oxide. A semiconductor such as a metal oxide containing an impurity element may be used. Alternatively, the conductive films may be formed using a conductive paste of silver, carbon, copper, or the like or a conductive polymer such as a polythiophene. A conductive paste is preferable because it is inexpensive. A conductive polymer is preferable because it is easily applied.

The semiconductor film 508 can be formed in the following manner: a metal oxide film is formed, a resist mask is formed, the metal oxide film is etched, and the resist mask is removed.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using either of an inert gas and an oxygen gas. Note that there is no particular limitation on the flow ratio of oxygen (the partial pressure of oxygen) in the step of forming the metal oxide film. In the case where a transistor having high field-effect mobility is obtained, the flow ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained. The metal oxide film preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium).

The substrate temperature in the step of forming the conductive film is preferably higher than or equal to room temperature and lower than or equal to 350° C., more preferably higher than or equal to room temperature and lower than or equal to 300° C.

Figure 2C:
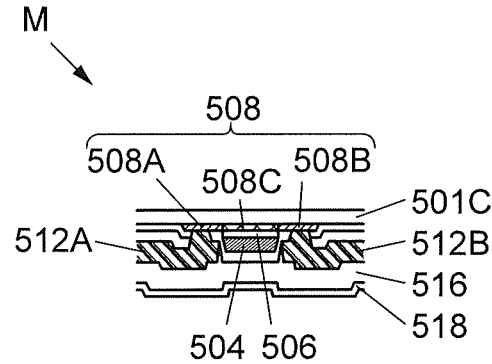

In the transistor M, the conductive film 504 serves as a gate electrode, the insulating layer 506 serves as a gate insulating layer, and the conductive layer 512A and the conductive layer 512B serve as a source and a drain (FIG. 2C).

Through the above steps, the insulating layer 501C and the transistor M can be formed over the resin layer 500A.

Next, the insulating layer 516 that covers the transistor M is formed. The insulating layer 516 can be formed using a method similar to that of the insulating layer 501C.

It is preferable to use an oxide insulating film, such as a silicon oxide film or a silicon oxynitride film, formed in an atmosphere containing oxygen as the insulating layer 516. The insulating layer 518 with low oxygen diffusibility and oxygen permeability, such as a silicon nitride film, is preferably stacked over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the semiconductor film 508. As a result, oxygen vacancies in the semiconductor film 508 can be filled and defects at the interface between the semiconductor film 508 and the insulating layer 506 can be repaired, leading to a reduction in defect levels. Accordingly, an extremely highly reliable display device can be fabricated.

According to one embodiment of the present invention, the insulating layer 518 is further formed over the insulating layer 516.

Then, the insulating layer 521 is formed over the insulating layer 518. The display element is formed on the insulating layer 521 in a later step; thus, the insulating layer 521 preferably functions as a planarization layer. For the insulating layer 521, the description of the organic insulating film or the inorganic insulating film that can be used for the insulating layer 501C can be referred to.

The insulating layer 521 is formed at a temperature lower than or equal to the allowable temperature limit of the resin layer 500A. The insulating layer 521 is preferably formed at a temperature lower than the heating temperature in the above-described postbake treatment.

In the case of using an organic insulating film for the insulating layer 521, it is preferable that the temperature applied to the resin layer 500A in forming the insulating layer 521 be higher than or equal to room temperature and lower than or equal to 350° C., further preferably higher than or equal to room temperature and lower than or equal to 300° C.

In the case of using an inorganic insulating film as the insulating layer 521, the substrate temperature during the deposition is preferably higher than or equal to room temperature and lower than or equal to 350° C., further preferably higher than or equal to 100° C. and lower than or equal to 300° C.

Next, an opening reaching the conductive layer 512B is formed in the insulating layer 521, the insulating layer 518, and the insulating layer 516.

After that, the third electrode 551($i, j$) is formed. The third electrode 551($i, j$) partly functions as a pixel electrode of the self-luminous display element 550($i, j$). The third electrode 551($i, j$) can be formed in the following manner: a conductive film is formed, a resist mask is formed, the conductive film is etched, and the resist mask is removed.

The third electrode 551($i, j$) is formed at a temperature lower than or equal to the allowable temperature limit of the resin layer 500A. The third electrode 551($i, j$) is preferably formed at a temperature lower than the heating temperature in the above-described postbake treatment.

The substrate temperature in the step of forming the conductive film is preferably higher than or equal to room temperature and lower than or equal to 350° C., further preferably higher than or equal to room temperature and lower than or equal to 300° C.

Next, the insulating film 528 is formed to cover an end portion of the third electrode 551($i, j$). For the insulating film 528, an organic insulating film or an inorganic insulating film which can be used for the insulating layer 501C can be referred to.

The insulating film 528 is formed at a temperature lower than or equal to the allowable temperature limit of the resin layer 500A. The insulating film 528 is preferably formed at a temperature lower than the heating temperature in the above-described postbake treatment.

In the case of using an organic insulating film as the insulating film 528, it is preferable that the temperature applied to the resin layer 500A in forming the insulating film 528 be higher than or equal to room temperature and lower than or equal to 350° C., further preferably higher than or equal to room temperature and lower than or equal to 300° C.

In the case of using an inorganic insulating film as the insulating film 528, the substrate temperature during the deposition is preferably higher than or equal to room temperature and lower than or equal to 350° C., further preferably higher than or equal to 100° C. and lower than or equal to 300° C.

Next, the layer 553($i, j$) containing the organic compound and the fourth electrode 552 are formed. The fourth electrode 552 partly functions as a common electrode of the self-luminous display element 550($i, j$).

The layer 553($i, j$) containing the organic compound can be formed by an evaporation method, a coating method, a printing method, a discharge method, or the like. In the case where the layer 553($i, j$) containing the organic compound is formed for each individual pixel, an evaporation method using a shadow mask such as a metal mask, an ink jet method, or the like can be used. In the case of sharing the layer 553($i, j$) containing the organic compound by some pixels, an evaporation method not using a metal mask can be used.

Either a low molecular compound or a high molecular compound can be used for the layer 553($i, j$) containing the organic compound, and an inorganic compound may also be used.

The fourth electrode 552 can be formed using an evaporation method, a sputtering method, or the like.

The fourth electrode 552 is formed at a temperature lower than or equal to the allowable temperature limit of the resin layer 500A and lower than or equal to the allowable temperature limit of the layer 553($i$, $j$) containing the organic compound. The fourth electrode 552 is preferably formed at a temperature lower than the heating temperature in the above-described postbake treatment.

Through the above steps, the self-luminous display element 550($i$, $j$) can be formed. The self-luminous display element 550($i$, $j$) has a structure in which the third electrode 551($i$, $j$) partly serving as a pixel electrode, the layer 553($i$, $j$) containing the organic compound, and the fourth electrode 552 partly serving as a common electrode are stacked.

Although a top-emission light-emitting element is formed as the self-luminous display element 550($i$, $j$) here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Although not illustrated, an insulating layer may be formed to cover the fourth electrode 552. The insulating layer serves as a protective layer for suppressing diffusion of impurities such as water into the self-luminous display element 550($i$, $j$). The self-luminous display element 550($i$, $j$) is sealed with the insulating layer.

The insulating layer is formed at a temperature lower than or equal to the allowable temperature limit of the resin layer 500A and lower than or equal to the allowable temperature limit of the self-luminous display element 550($i$, $j$). The insulating layer is preferably formed at a temperature lower than the heating temperature in the above-described postbake treatment.

Next, the protective layer 560 is formed over the fourth electrode 552. The protective layer 560 can be used as a layer positioned on the outermost surface of the display device. The protective layer 560 preferably has a high visible-light transmitting property.

The above-described organic insulating film that can be used for the insulating layer 501C is preferably used for the protective layer 560 because the surface of the display device can be prevented from being damaged or cracked.

<Attachment of Structure Body 601D and Structure Body 601A>

FIG. 4B illustrates an example where the structure body 601D is attached to the protective layer 560 with the bonding layer 505.

As the bonding layer 505, various curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

<Separation of Substrate 500>

Figure 5A:
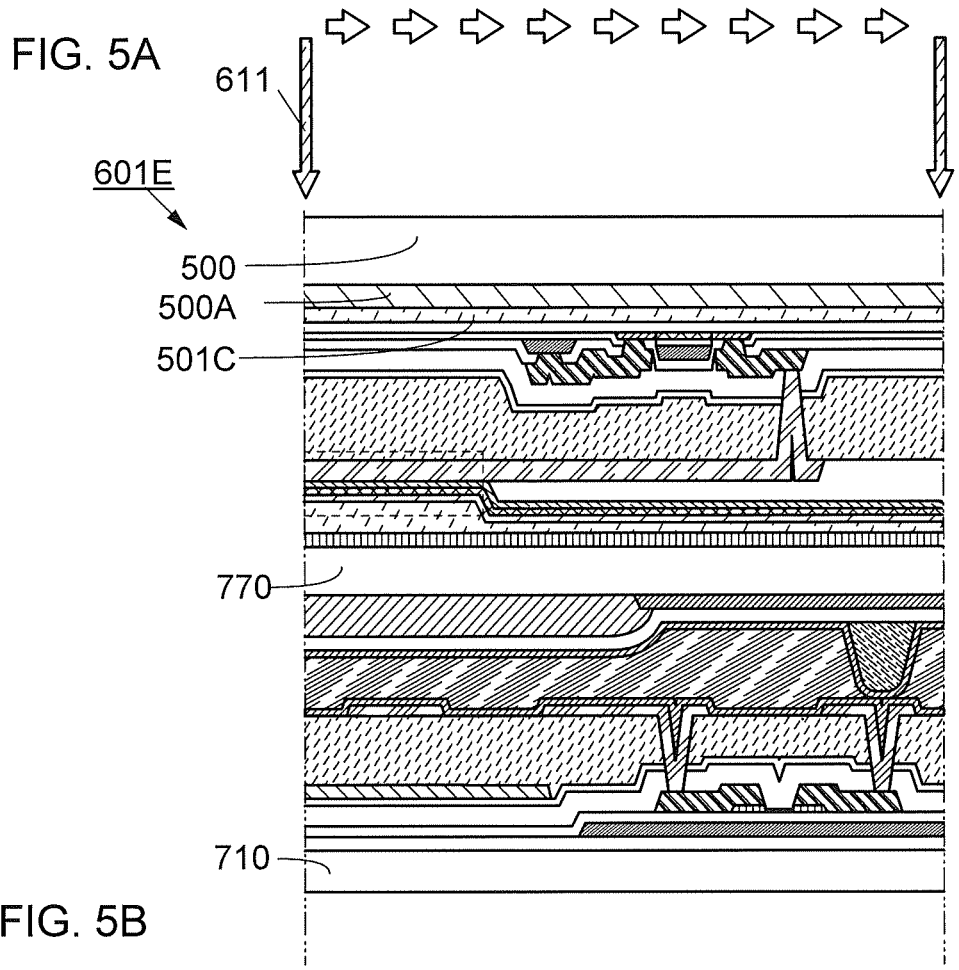
FIGS. 5A and 5B are each a cross-sectional view of a structure body included in a display device of one embodiment of the present invention.

Next, the resin layer 500A is irradiated with laser light 611 through the substrate 500. The laser light 611 is, for example, a linear laser beam with which scanning is performed from the left side to the right side in FIG. 5A, and the major axis is perpendicular to the scanning direction and the incident direction (from top to bottom).

The resin layer 500A absorbs the laser light 611.

With irradiation with the laser light 611, the resin layer 500A is weakened. Alternatively, with irradiation with the laser light 611, the adhesion between the resin layer 500A and the substrate 500 is decreased.

As the laser light 611, light, at least part of which has a wavelength at which the light passes through the substrate 500 and the light is absorbed by the resin layer 500A is used. The laser light 611 is preferably light with a wavelength range from visible light to ultraviolet light. For example, light with a wavelength in a range of 200 nm to 400 nm, preferably a range of 250 nm to 350 nm can be used. In particular, an excimer laser with a wavelength of 308 nm is preferably used because the productivity is increased. An excimer laser is used for LTPS laser crystallization and an apparatus for an existing LTPS manufacturing line can be used; thus, new capital investment is not needed. A solid-state UV laser (also referred to as a semiconductor UV laser), such as a UV laser with a wavelength of 355 nm that is the third harmonic of a Nd:YAG laser, may be used. A solid-state laser is preferable because the solid-state laser does not use a gas and thus the running cost can be reduced to approximately ⅓ of the case of an excimer laser. A pulsed laser such as a picosecond laser may be used.

In the case where linear laser light is used as the laser light 611, the substrate 500 and a light source are relatively moved, scanning is performed with the laser light 611, and a region that is desirably separated is irradiated with the laser light 611.

Next, the substrate 500 is separated from the structure body 601E.

For example, the substrate 500 can be separated from the structure body 601E by applying perpendicular force to the substrate 500. Specifically, the substrate 500 can be peeled by attaching a mechanism to part of the top surface of the substrate 500 and pulling up the substrate 500.

By inserting a sharp instrument such as a knife between the substrate 500 and the insulating layer 501C, the separation starting point may be formed. Alternatively, by making a cut in the resin layer 500A with a sharp instrument, the separation starting point may be formed.

The position of the separation surface may vary depending on materials and the formation methods of the resin layer 500A, the substrate 500, and the like, conditions of light irradiation, and the like.

Although the resin layer 500A serves as a protective layer of the structure body 601E, the resin layer 500A may be completely removed in consideration of transmittance and the like.

Figure 5B:
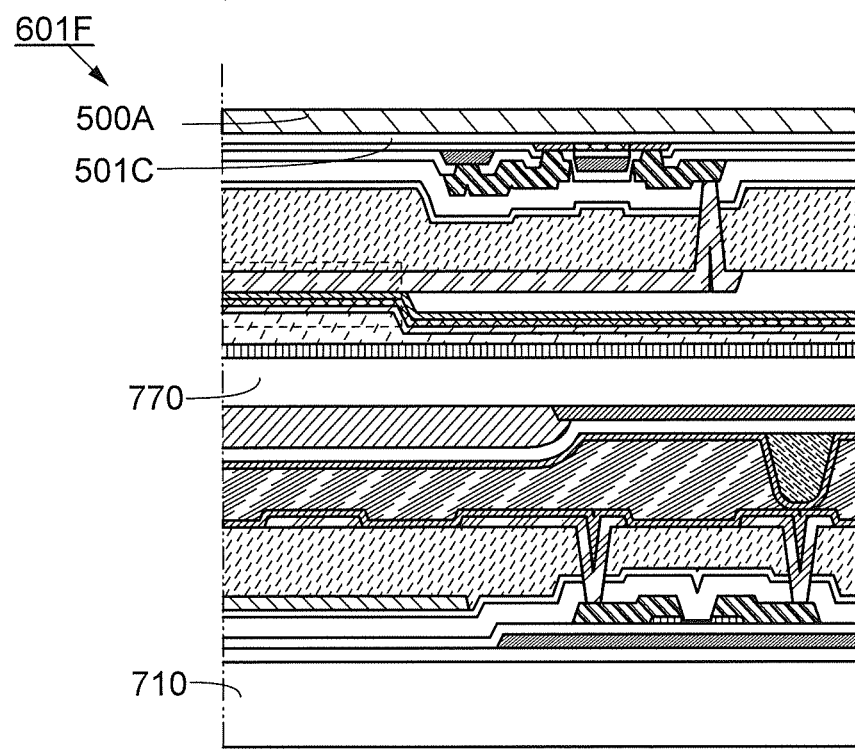

Thus, a structure body 601F illustrated in FIG. 5B can be obtained. Through the above steps, a display device can be manufactured in which a reflective display element is formed over the substrate so that light is reflected in a direction in which the reflective display element is formed with respect to the substrate and a self-luminous display element is formed over the reflective display element.

Note that this embodiment can be combined with any of the other embodiments in this specification as appropriate.

(Embodiment 4)

In this embodiment, a display device of one embodiment of the present invention, which has a structure different from that illustrated in FIGS. 2A to 2C, will be described.

<Structure Example 2 of Display Device>

Figure 6:
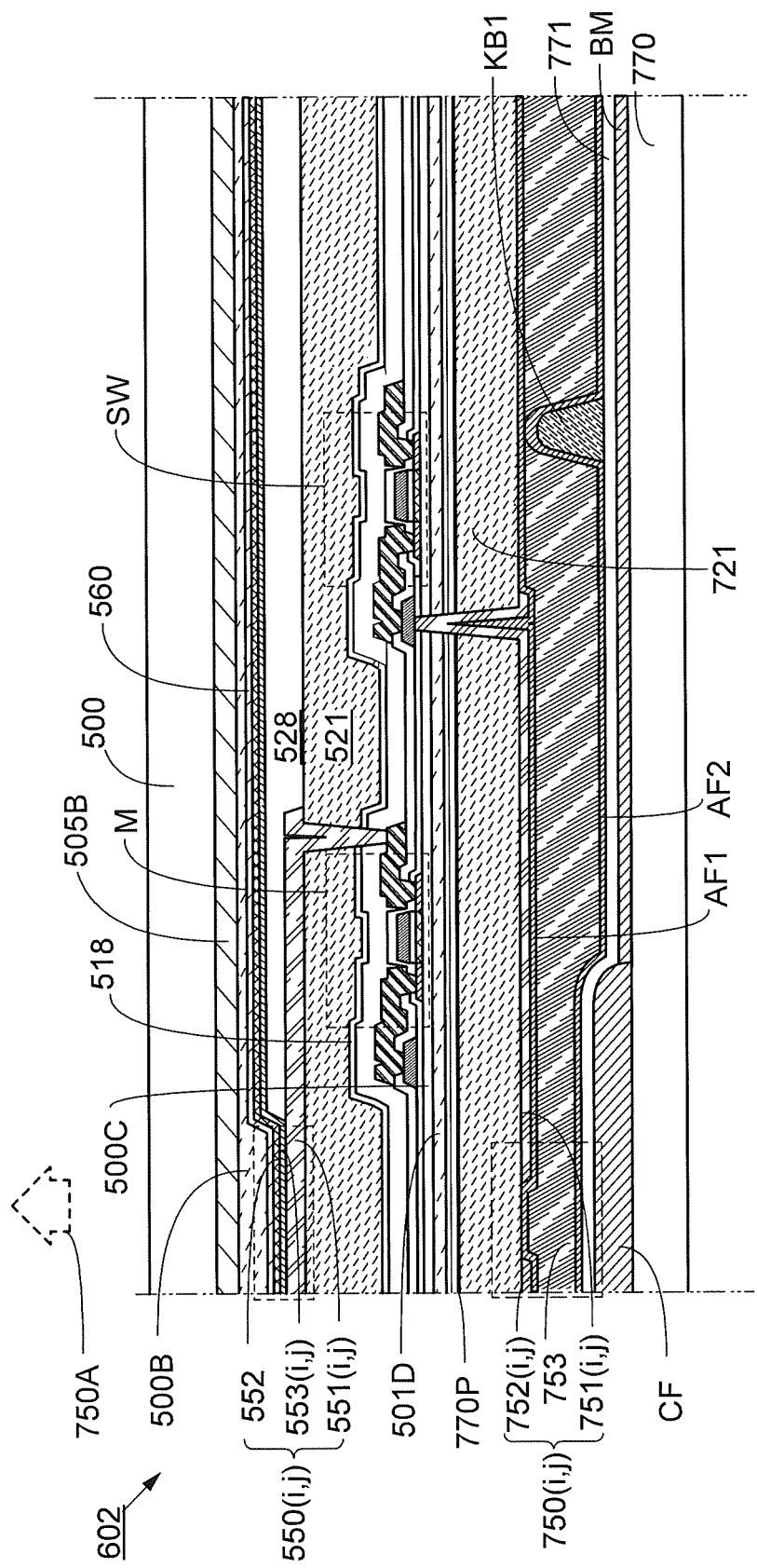
FIG. 6 is a cross-sectional view of a structure body included in a display device of one embodiment of the present invention.

FIG. 6 illustrates a structure body 602 some components of which are different from those of the structure body 601. Also in the structure body 602, the first electrode 751($i$, $j$) and the second electrode 752($i$, $j$) are provided to enable display in an in-plane switching (IPS) mode.

A display panel including the structure body 602 illustrated in FIG. 6, which is one embodiment of the present invention, includes the substrate 770.

Display of the first display element 750(*i*, *j*) is controlled by the transistor SW. Display of the second display element 550(*i*, *j*) is controlled by the transistor M. A semiconductor layer of each of the transistor SW and the transistor M is formed in contact with an insulating layer 501D.

The layer 753 containing the liquid crystal material is between the transistor SW and the substrate 770 or between the transistor M and the substrate 770. In other words, the first display element 750(*i*, *j*) is provided between the insulating layer 501D and the substrate 770.

The display device including the structure body 602, which is one embodiment of the present invention, in which the transistor SW and the transistor M are manufactured using the same material to have the same structure can be manufactured in a small number of steps compared with the display device including the structure body 601, so that high productivity can be obtained.

A method for manufacturing the structure body 602 will be described with reference to FIGS. 7A and 7B.

Figure 7A:
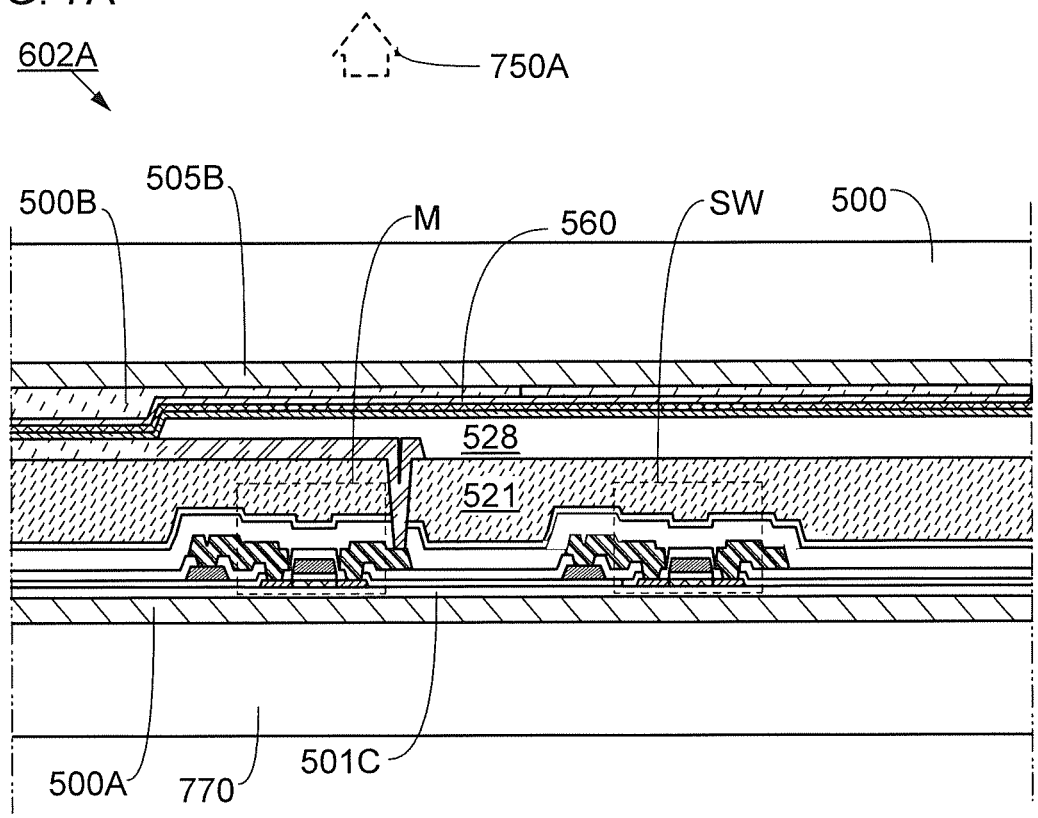
FIGS. 7A and 7B are each a cross-sectional view of a structure body included in a display device of one embodiment of the present invention.
Figure 7B:
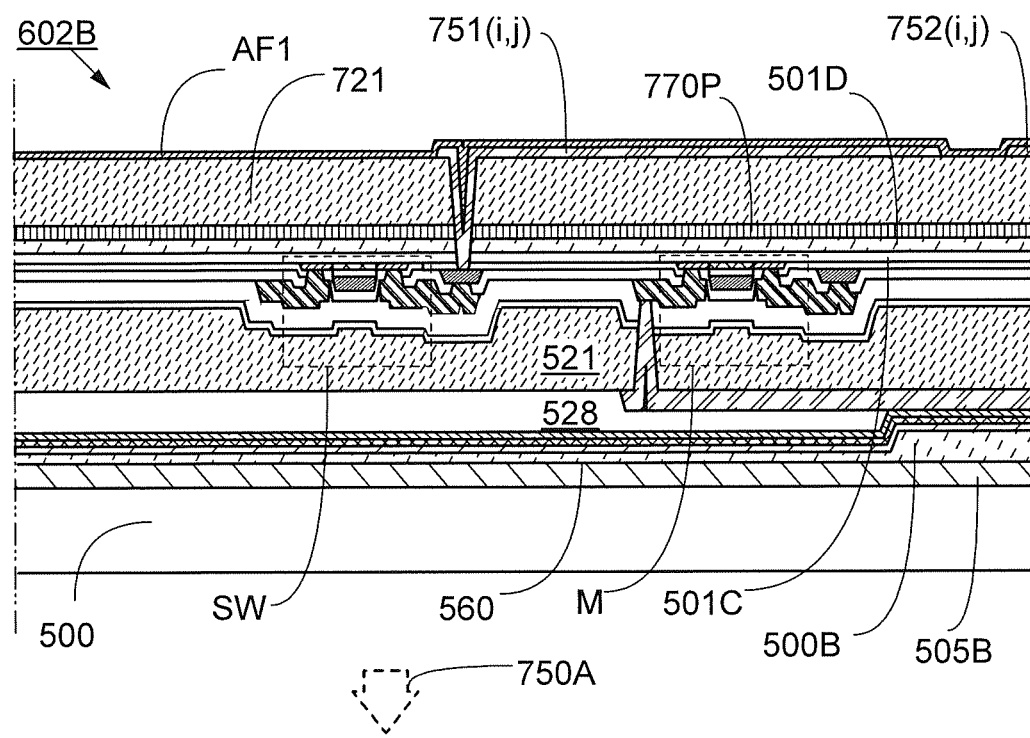

In the method for manufacturing the structure body 602A illustrated in FIG. 7A, the resin layer 500A is formed over the substrate 770 first. As in the case of the structure body 601, the resin layer 500A is preferably formed using a photosensitive polyimide resin. Next, the transistor SW and the transistor M are formed over the insulating layer 501C in manners similar to those of the transistors SW and M in the structure body 601. The transistors SW and M are formed at a temperature lower than or equal to the allowable temperature limit of a polyimide resin. For example, a transistor using a metal oxide for a semiconductor film can be used.

Next, the insulating layer 518 and the insulating layer 521 are formed. An opening is formed in the insulating layer 518 and the insulating layer 521, and then the third electrode 551(*i*, *j*) is formed. After the insulating film 528 is formed, the layer 553(*i*, *j*) containing the organic compound and the fourth electrode 552 are formed.

Next, the protective layer 560 and the resin layer 500B are formed and bonded to the substrate 500 with a bonding layer 505B. Consequently, the structure body 602A is formed. Although the resin layer 500B and the bonding layer 505B are formed in the structure body 602A, only the bonding layer 505B may be formed.

Here, irradiation with the laser light 611 (not illustrated) is performed from the substrate 770 side of the structure body 602A. The resin layer 500A is formed using a material that facilitates separation caused by the irradiation with the laser light 611 more than the material used for the resin layer 500B. Thus, the substrate 770 is separated from the structure body 602A at the resin layer 500A.

After the resin layer 500A is removed by oxygen plasma treatment or the like, the insulating layer 501D is formed in contact with the exposed insulating layer 501C. The insulating layer 501D is formed to perform planarization and prevent diffusion of impurities. The same material as the insulating layer 501C can be used for the insulating layer 501D. Note that the insulating layer 501D is not necessarily formed in the case where planarization and prevention of diffusion of impurities are not needed.

Next, the functional film 770P is formed. The functional film 770P is a polarizing plate in one embodiment of the present invention. The insulating film 721 is formed thereover. The insulating film 721 is provided to perform planarization and prevent diffusion of impurities. The functional film 770P can be formed by attaching a resin sheet or the like.

An opening is formed in the insulating film 721, the functional film 770P, and the insulating layer 501D, and the first electrode 751(*i*, *j*) is formed to be electrically connected to the source electrode or the drain electrode of the transistor SW. At that time, the second electrode 752(*i*, *j*) is also formed using the same material. The second electrode 752(*i*, *j*) is electrically connected to a wiring through which a common potential is supplied.

Next, the alignment film AF1 is formed, so that a structure body 602B is obtained. Then, in a manner similar to that in the case of fabricating the structure body 601, the substrate 770 and the substrate 500 are bonded to each other with a sealant, and the layer 753 containing the liquid crystal material is sealed between the alignment film AF1 and the alignment film AF2. Through such steps, the structure body 602 is obtained.

Although the functional film 770P is provided between the insulating film 721 and the insulating layer 501D in one embodiment of the present invention, the functional film 770P may be provided so that the substrate 500 is positioned between the functional film 770P and the bonding layer 505B.

<Structure Example 3 of Display Device>

Figure 8A:
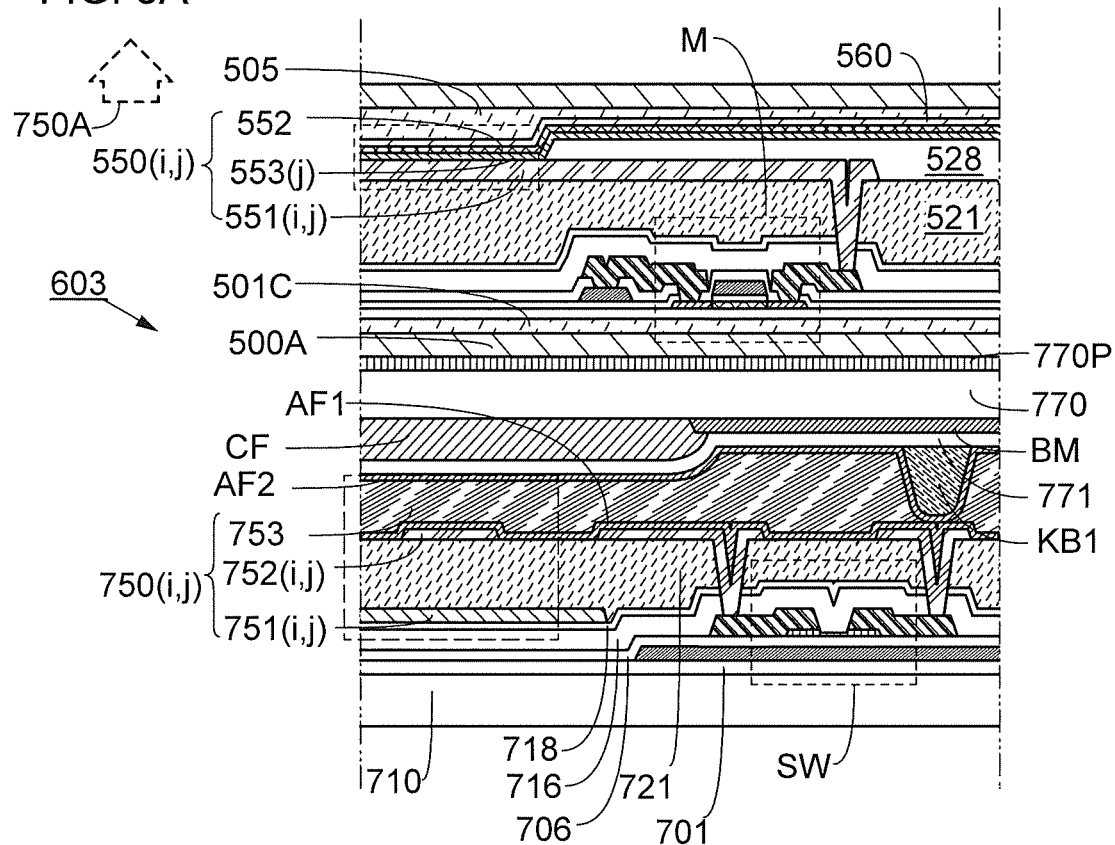
FIGS. 8A and 8B are each a cross-sectional view of a structure body included in a display device of one embodiment of the present invention.

FIG. 8A illustrates a structure body 603 some components of which are different from those of the structure body 601. Also in the structure body 603, the first electrode 751(*i*, *j*) and the second electrode 752(*i*, *j*) are provided to enable display in an FFS mode.

A display panel including the structure body 603, which is one embodiment of the present invention, includes the substrate 710 and the substrate 770.

Display of the first display element 750(*i*, *j*) is controlled by the transistor SW. Display of the second display element 550(*i*, *j*) is controlled by the transistor M. A semiconductor layer of the transistor M is formed in contact with the insulating layer 501C. A semiconductor layer of the transistor SW is formed in contact with the insulating film 706.

In the structure body 603, the insulating layer 501C is provided between the first display element 750(*i*, *j*) and the second display element 550(*i*, *j*). The insulating film 706 is provided between the first display element 750(*i*, *j*) and the substrate 710.

<Structure Example 4 of Display Device>

Figure 8B:
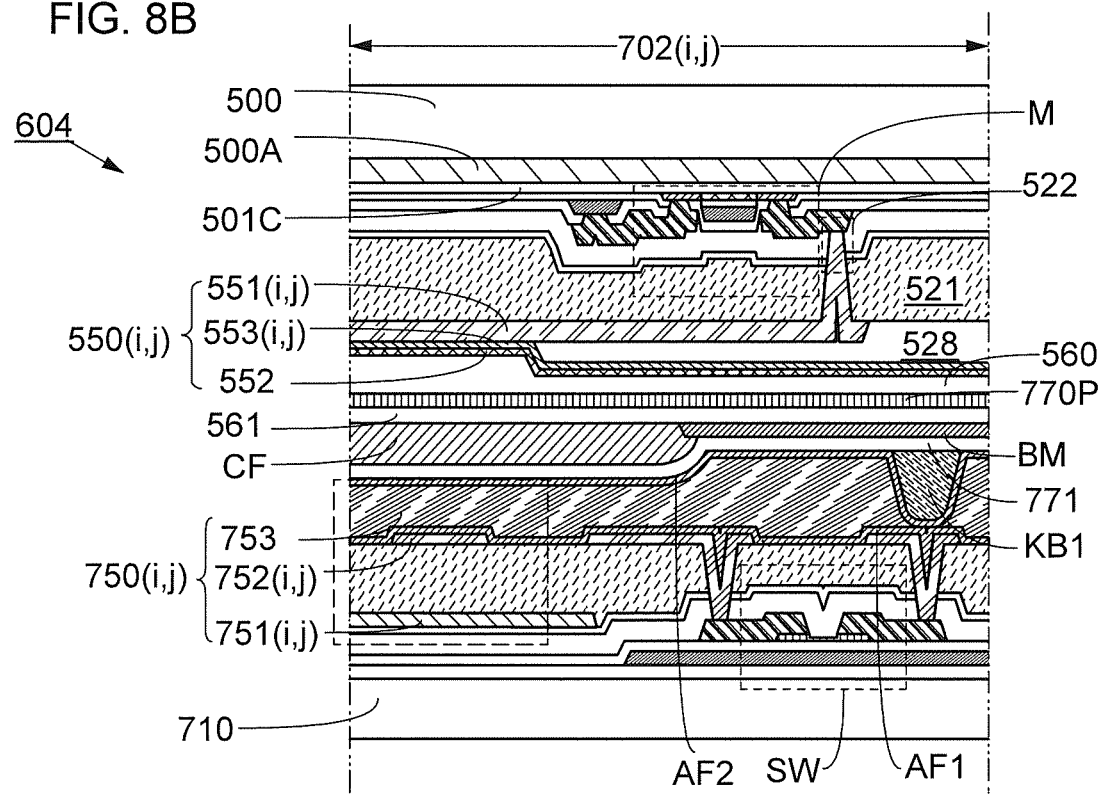

FIG. 8B illustrates a structure body 604 some components of which are different from those of the structure body 601. Also in the structure body 604, the first electrode 751(*i*,*j*) and the second electrode 752(*i*, *j*) are provided to enable display in an FFS mode.

As in the structure body 601, the second display element 550(*i*, *j*) is provided between the insulating layer 501C and the first display element 750(*i*, *j*) in a display panel of one embodiment of the present invention that includes the structure body 604.

The structure body 604 includes the substrate 710 and the substrate 500. A method for manufacturing the structure body 604 does not include a separation step using laser treatment.

The substrate 500 is separated by laser treatment and attached to the substrate 770 in the structure body 601. Meanwhile, in the structure body 604, the substrate 500 is left, the functional film (polarizing plate) 770P and the coloring film CF are formed over the substrate 500, and the layer 753 containing the liquid crystal material is sealed between the substrate 500 and the substrate 710.

Since the second display element 550(*i*, *j*) is provided between the substrate 500 and the substrate 710 in the structure body 604, the structure body 604 has higher reliability than the structure body 601 in the case where the second display element 550(i, j) is likely to deteriorate owing to high humidity.

<Structure Example 5 of Display Device>

Figure 9A:
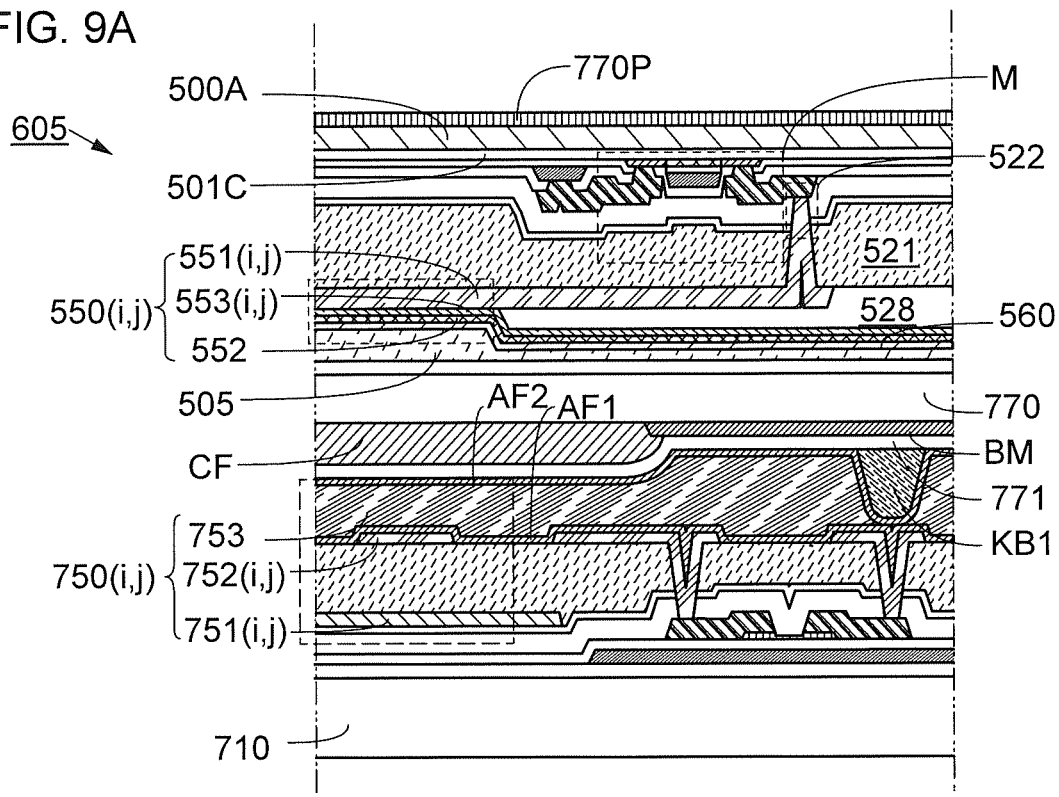
FIGS. 9A and 9B are each a cross-sectional view of a structure body included in a display device of one embodiment of the present invention.

FIG. 9A illustrates a structure body 605 some components of which are different from those of the structure body 601. Also in the structure body 605, the first electrode 751(i, j) and the second electrode 752(i, j) are provided to enable display in an FFS mode.

Unlike in the structure body 601, the functional film 770P is formed over the resin layer 500A in a display panel including the structure body 605 of one embodiment of the present invention. The functional film 770P can be formed by being attached to the resin layer 500A by an adhesive or the like in the final step of the manufacturing process.

The thickness of the functional film 770P does not need to be considered in the manufacturing process of the structure body 605, and a high degree of freedom for design, e.g., diversity of the functional film 770P to be used, can be achieved.

<Structure Example 6 of Display Device>

Figure 9B:
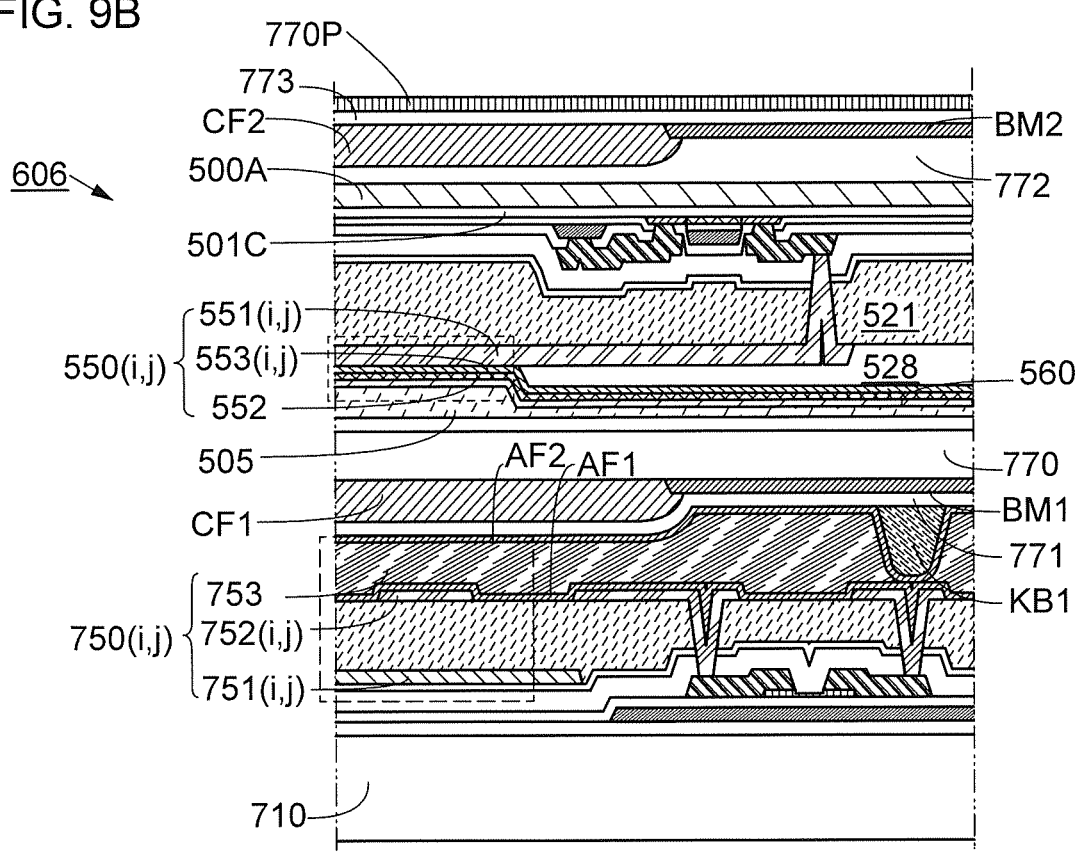

FIG. 9B illustrates a structure body 606 some components of which are different from those of the structure body 605.

Unlike in the structure body 605, the insulating film 772 is formed over the resin layer 500A in a display panel including the structure body 606 of one embodiment of the present invention. The coloring film CF2 and a light-blocking film BM2 are formed in contact with the insulating film 772. In other words, there is a region where two coloring films and two light-blocking films, including the coloring film CF1 and a light-blocking film BM1 which are formed in contact with the substrate 770, overlap each other in a direction perpendicular to the substrate.

An insulating film 773 is provided in contact with the coloring film CF2 and the light-blocking film BM2. The functional film 770P is provided over the insulating film 773.

In the structure body 606, the second display element 550(i, j) can be a self-luminous display element that emits white light. When a plurality of coloring films are provided, the color purity of desired light can be improved.

<Structure Example 7 of Display Device>

Figure 10A:
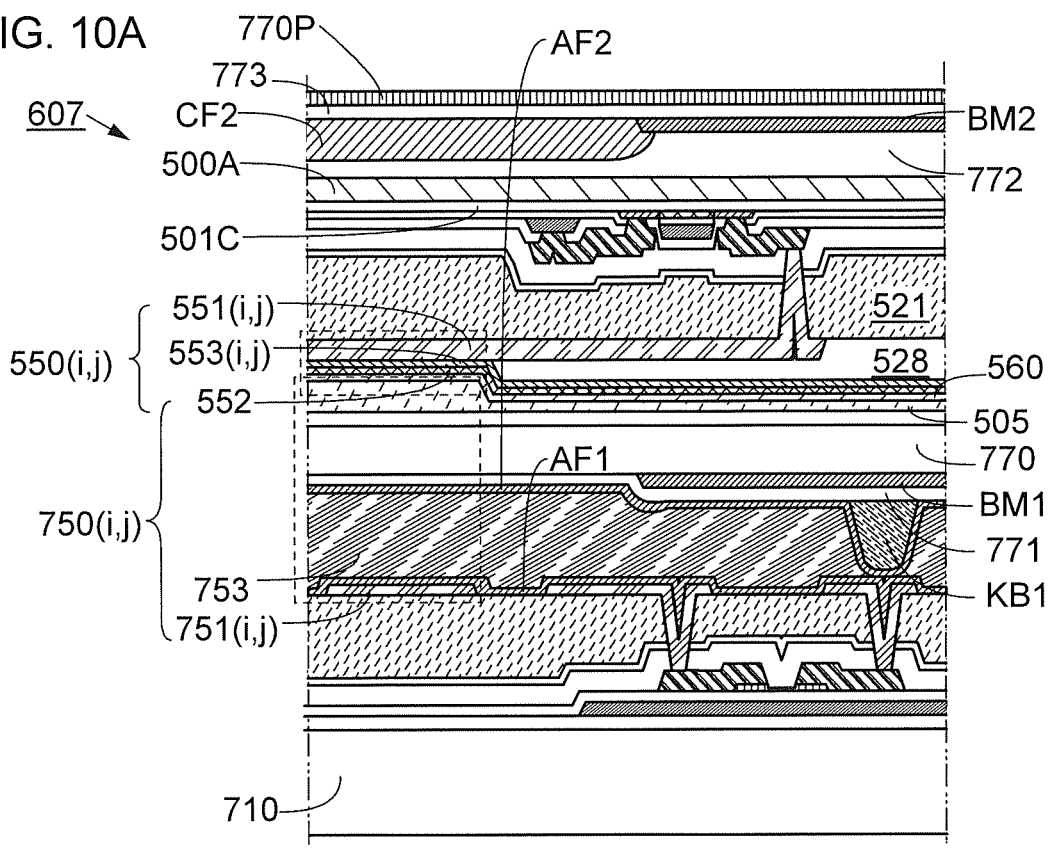
FIGS. 10A and 10B are each a cross-sectional view of a structure body included in a display device of one embodiment of the present invention.

FIG. 10A illustrates a structure body 607 some components of which are different from those of the structure body 606.

Unlike in the structure body 606, in a display panel including the structure body 607 of one embodiment of the present invention, an electric field for controlling alignment of the liquid crystal material contained in the layer 753 containing the liquid crystal material is formed between the fourth electrode 552 electrically connected to a wiring through which a common potential is supplied and the first electrode 751(i, j).

In other words, a reflective display element in the structure body 607 can be driven in a vertical alignment (VA) mode.

In a display panel including the structure body 607 of one embodiment of the present invention, the coloring film CF2 and the light-blocking film BM2 are formed. One coloring film and one light-blocking film are provided in a direction perpendicular to the substrate.

<Structure Example 8 of Display Device>

Figure 10B:
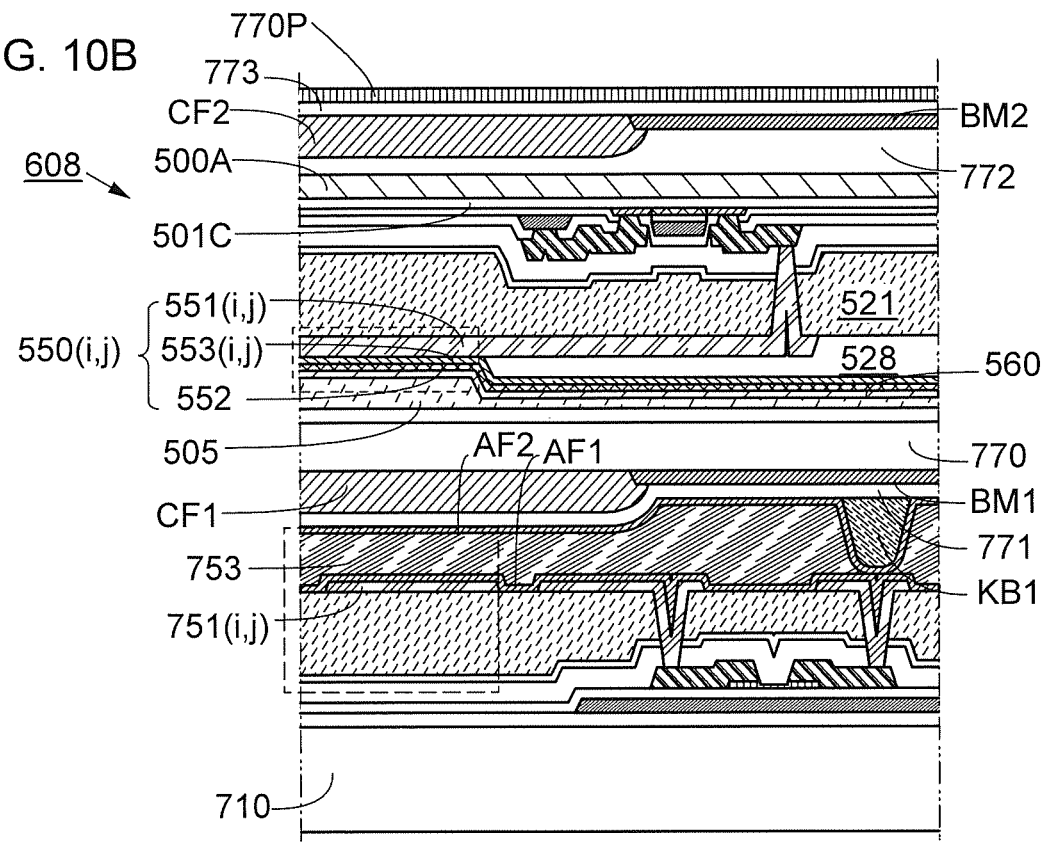

FIG. 10B illustrates a structure body 608 some components of which are different from those of the structure body 606.

As in the structure body 607, in a display panel including the structure body 608 of one embodiment of the present invention, an electric field for controlling alignment of the liquid crystal material contained in the layer 753 containing the liquid crystal material is formed between the fourth electrode 552 electrically connected to a wiring through which a common potential is supplied and the first electrode 751(i, j).

In other words, a reflective display element in the structure body 608 can be driven in a vertical alignment (VA) mode.

As in the structure body 606, the structure body 608 includes a region where two coloring films overlap with each other in a direction perpendicular to the substrate. Similarly, the structure body 608 may include a region where two light-blocking films overlap with each other in a direction perpendicular to the substrate.

<Structure Example 9 of Display Device>

Figure 11:
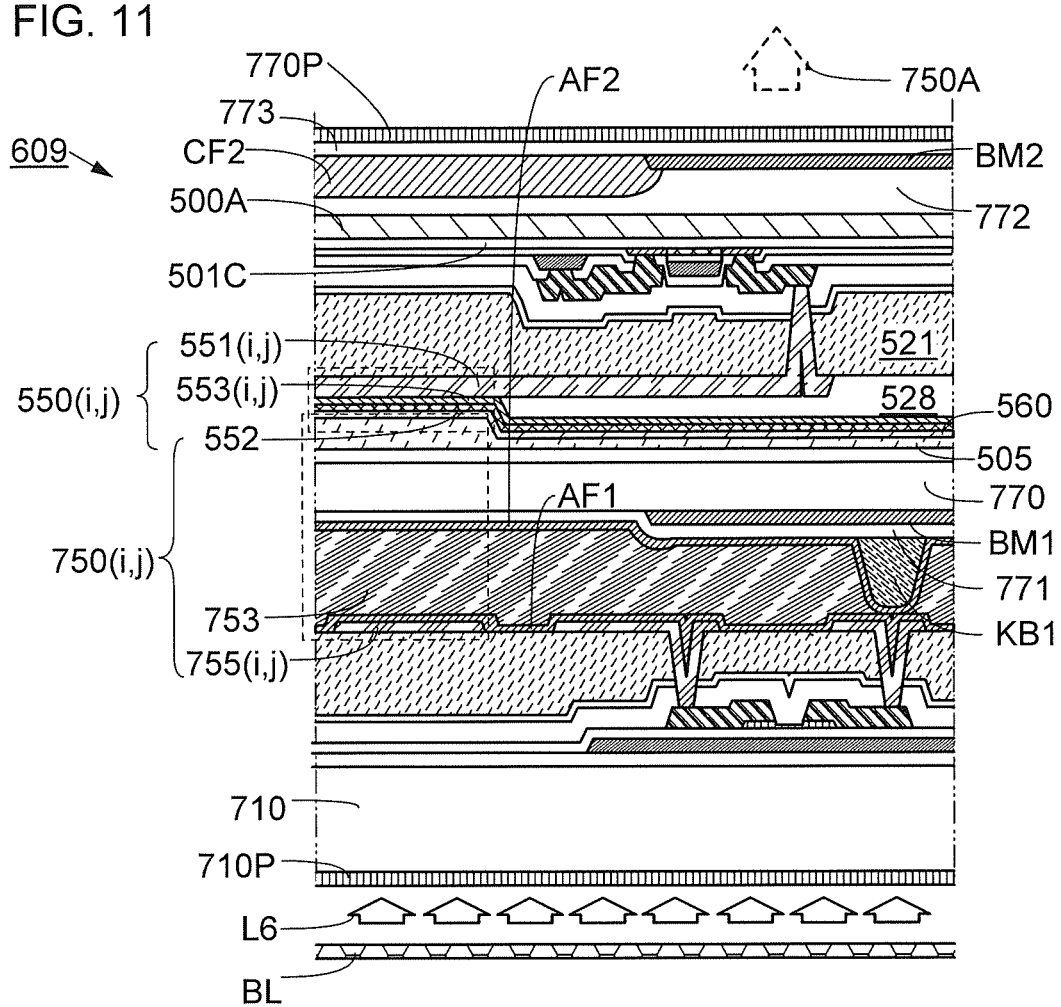
FIG. 11 is a cross-sectional view of a structure body included in a display device of one embodiment of the present invention.

FIG. 11 illustrates a structure body 609 some components of which are different from those of the structure body 607.

As in the structure body 607, in a display panel including the structure body 609 of one embodiment of the present invention, an electric field for controlling alignment of the liquid crystal material contained in the layer 753 containing the liquid crystal material is formed between the fourth electrode 552 electrically connected to a wiring through which a common potential is supplied and the third electrode 755(i, j).

As the third electrode 755(i, j) in the structure body 609, a conductive film whose reflectance is greater than or equal to 1%, preferably greater than or equal to 5% and less than 100% and whose light transmittance is greater than or equal to 1%, preferably greater than or equal to 10% and less than 100% with respect to light with a wavelength in a range of greater than or equal to 400 nm and less than 800 nm is used to serve as a light-reflective layer. A metal thin film whose thickness is set so that light is transmitted (preferably, approximately greater than or equal to 5 nm and less than or equal to 30 nm) can also be used as the third electrode 755(i, j).

Furthermore, the functional film 710P is formed so that the layer 753 containing the liquid crystal material is positioned between the functional film 710P and the functional film 770P.

The third electrode 755(i, j) may have a reflectance of less than or equal to 1% with respect to light with a wavelength in a range of greater than or equal to 400 nm and less than 800 nm. In this case, a film (not illustrated) whose reflectance is greater than or equal to 1%, preferably greater than or equal to 5% and less than 100% is provided between the third electrode 755(i, j) and the functional film 710P.

A backlight BL which can perform irradiation with light L6 in a direction indicated by an arrow 750A through the functional film 710P is provided. As the backlight BL, an underneath type or a sidelight type can be used.

Such a display panel including the structure body 609 can be used in manners similar to those of the structure bodies 601 to 607, and display by the first display element 750(i, j) can be clearly perceived owing to irradiation with the backlight BL. By making the backlight emit light of several colors by a field-sequential method, color display can be performed without forming a coloring film over the first display element 750(i, j). In that case, by making the backlight emit light of all colors, white display can be achieved. Because no coloring film is formed, the intensity of light L2 with respect to that of light L1 can be increased in FIGS. 1A to 1D. In other words, the first display element 750(i, j) can perform bright display.

In each of the structure bodies including display elements of embodiments of the present invention, a reflective display element is formed over a substrate so that light is reflected in the direction in which the reflective display element is formed with respect to the substrate and a self-luminous display element is formed over the reflective display element. One embodiment of the present invention is a structure body having such a structure, and a coloring film, a functional film (polarizing plate), the transistor M, and the transistor SW may be formed in any position in the structure body.

A structure body including a display element of one embodiment of the present invention preferably includes a photosensitive resin and is preferably manufactured through a separation step using laser treatment.

The structure described in this embodiment can be combined with any of the structures described in the other embodiments as appropriate.

(Embodiment 5)

In this embodiment, the structure of an input/output device of one embodiment of the present invention will be described with reference to FIG. 12, FIGS. 13A, 13B1, 13B2, and 13C, FIGS. 14A and 14B, and FIG. 15. The input/output device of one embodiment of the present invention has a structure in which the transistor SW and the transistor M are formed between the first display element 750(i, j) and the second display element 550(i, j) as in the structure body 602 illustrated in FIG. 6. The first display element 750(i, j) and the second display element 550(i, j) are formed between the substrate 770 and the substrate 570. The substrate 570 is provided between the functional film 770P and the second display element 550(i, j).

Figure 12:
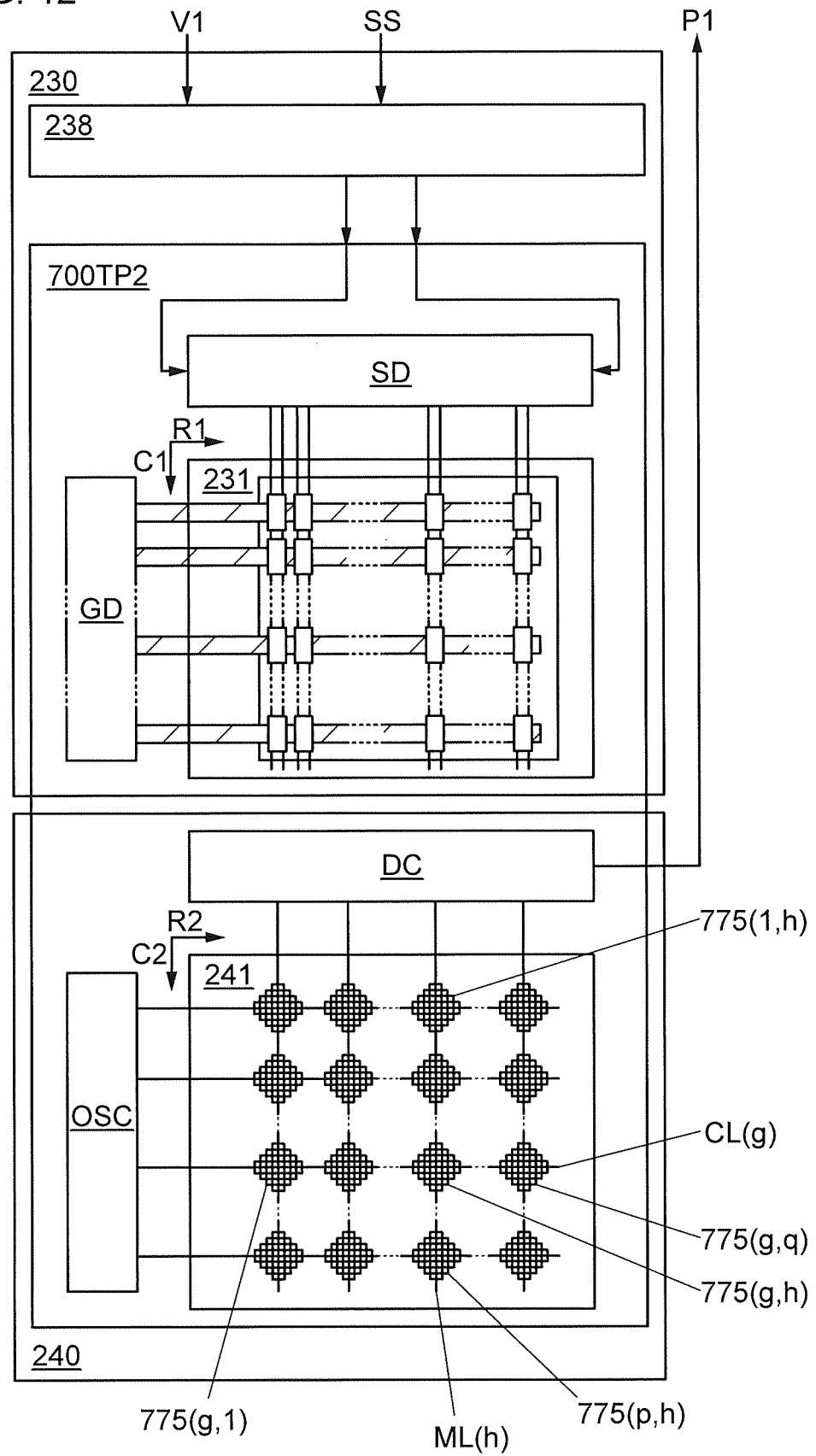
FIG. 12 is a block diagram illustrating a structure of an input portion which can be used for an input/output device in one embodiment.

FIG. 12 is a block diagram illustrating the structure of the input/output device of one embodiment of the present invention.

Figure 13A:
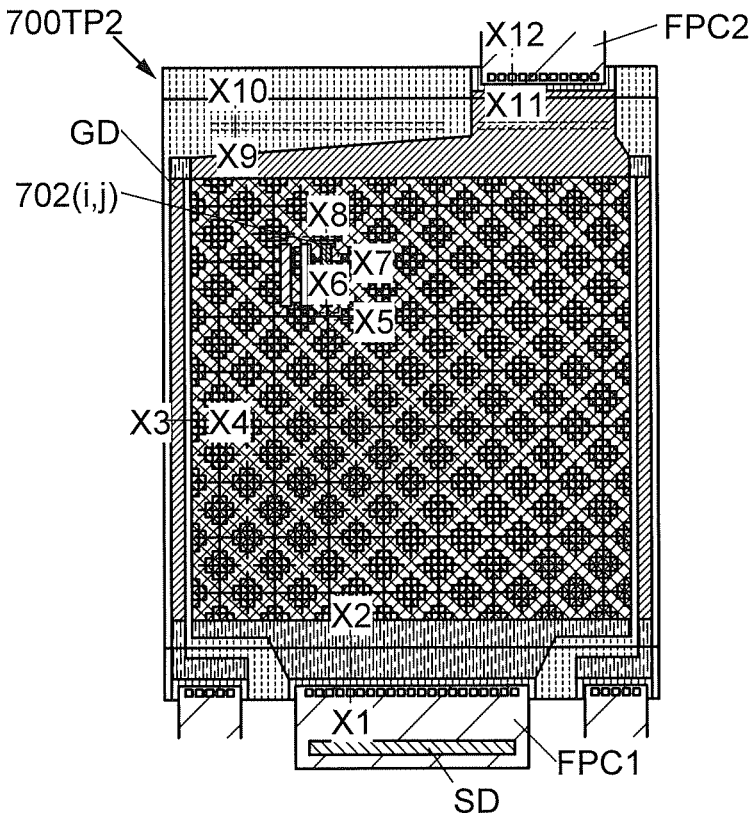
Figure 13A:
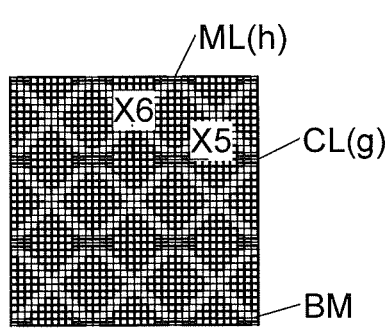
Figure 13A:
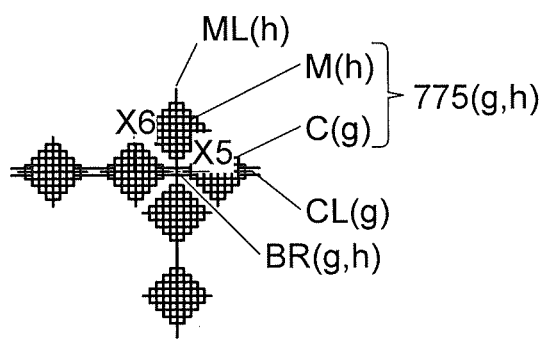
Figure 13C:
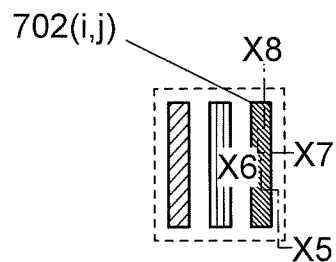

FIGS. 13A, 13B1, 13B2, and 13C illustrate the structure of an input/output panel which can be used for an input/output device of one embodiment of the present invention. FIG. 13A is a top view of the input/output panel. FIG. 13B1 is a schematic diagram illustrating part of an input portion of the input/output panel. FIG. 13B2 is a schematic diagram illustrating part of the structure in FIG. 13B1. FIG. 13C is a schematic diagram illustrating the structure of the pixel 702(i, j) which can be used for the input/output device.

Figure 14A:
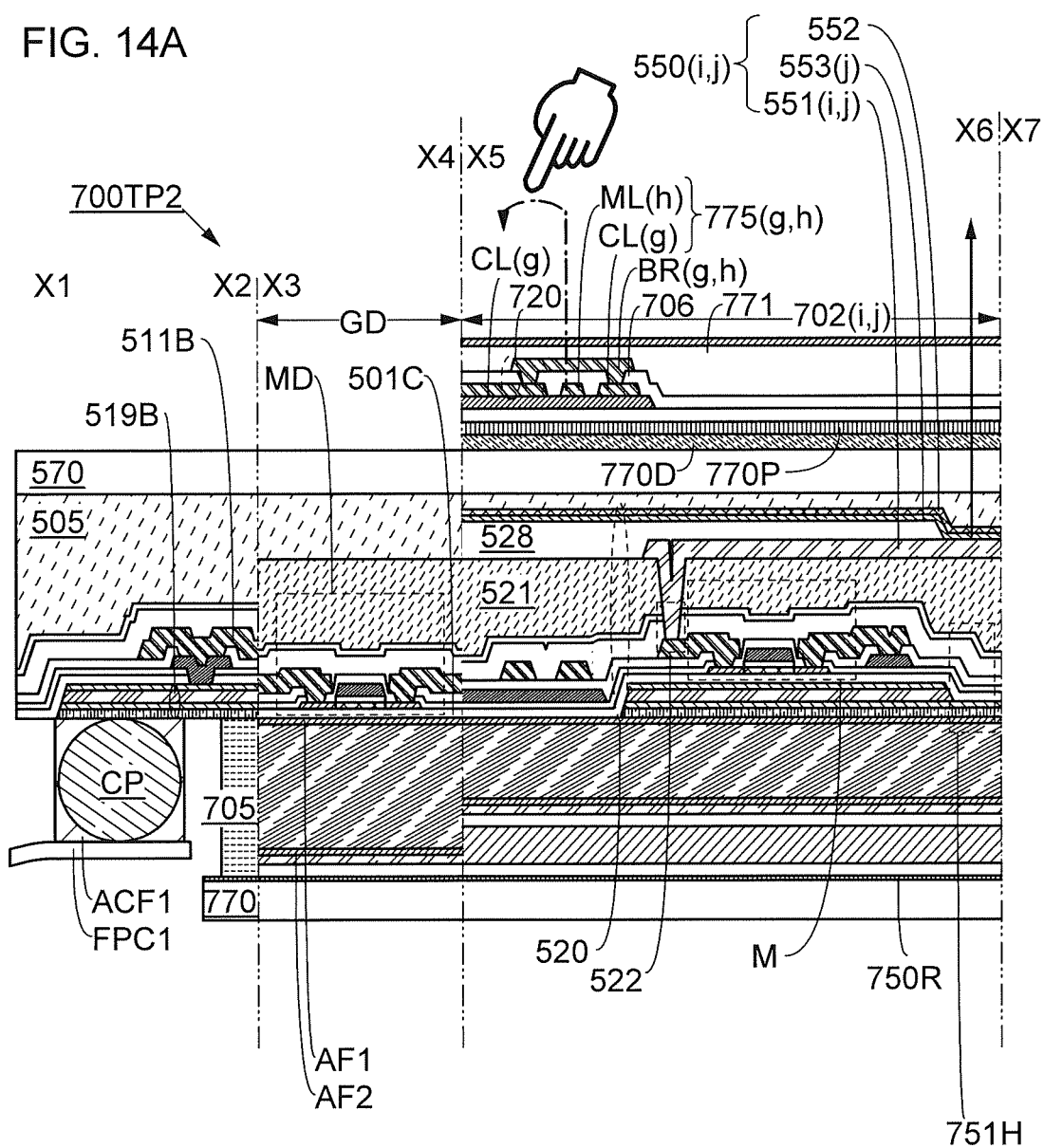
FIGS. 14A and 14B are cross-sectional views illustrating a structure of an input/output panel which can be used in an input/output device in one embodiment.
Figure 14B:
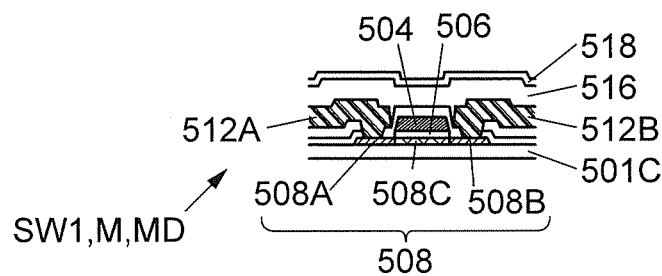
Figure 15:
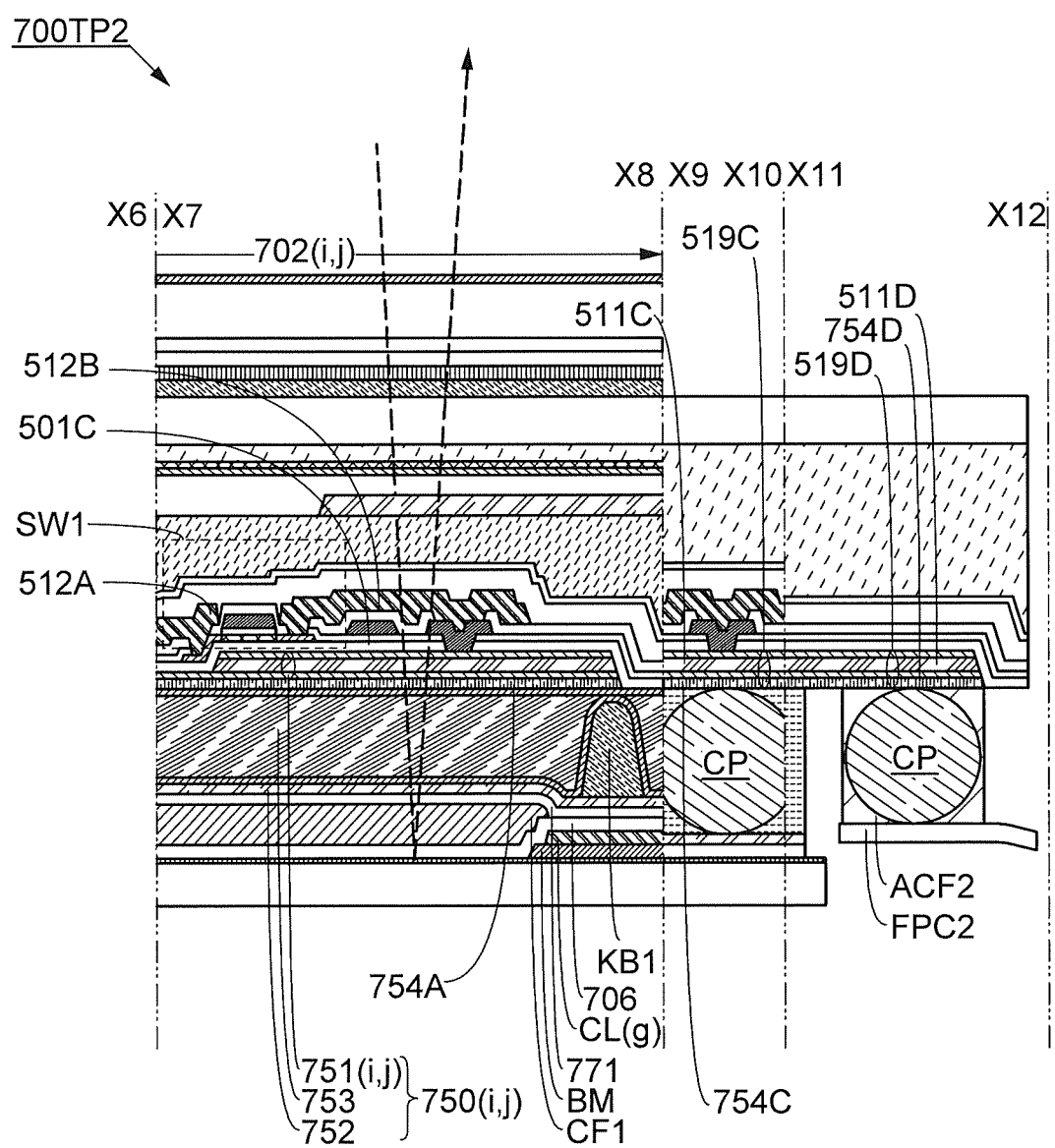
FIG. 15 is a cross-sectional view illustrating a structure of an input/output panel which can be used in an input/output device in one embodiment.

FIGS. 14A and 14B and FIG. 15 illustrate the structure of the input/output panel which can be used for the input/output device of one embodiment of the present invention. FIG. 14A is a cross-sectional view taken along cutting plane lines X1-X2, X3-X4, and X5-X6 in FIG. 13A. FIG. 14B is a cross-sectional view illustrating part of the structure in FIG. 14A.

FIG. 15 is a cross-sectional view taken along cutting plane lines X7-X8, X9-X10, and X11-X12 in FIG. 13A.

An example of a transmission path of light which reaches the first display element 750(i, j) is shown by a broken line in FIG. 15, and this is illustrated in consideration of depth; thus, even when the transmission path of light and another element overlap with each other in the drawings, the transmission path is secured.

<Structure Example of Input/Output Device>

The input/output device described in this embodiment includes a display portion 230 and an input portion 240 (see FIG. 12). Note that the input/output device includes an input/output panel 700TP2.

<Display Portion 230>

For example, any of the display devices described in Embodiments 1 to 4 can be used for the display portion 230.

The display portion 230 includes a control portion 238. The display portion 230 can include a driver circuit GD or a driver circuit SD. The control portion 238 is configured to obtain image data V1 and control data SS and control the driver circuit SD in accordance with these data.

A group of pixels of the display portion 230 are provided in the row direction (direction indicated by an arrow R1) and the column direction (direction indicated by an arrow C1) intersecting with the row direction.

The driver circuit GD is configured to supply a selection signal in accordance with the control data.

For example, the driver circuit GD is configured to supply a selection signal to one scan line at a frequency of 30 Hz or higher, preferably 60 Hz or higher, in accordance with the control data. Accordingly, moving images can be smoothly displayed.

For example, the driver circuit GD is configured to supply a selection signal to one scan line at a frequency of lower than 30 Hz, preferably lower than 1 Hz, more preferably less than once per minute, in accordance with the control data. Accordingly, a still image can be displayed while flickering is suppressed.

For example, any of a variety of sequential circuits, such as a shift register, can be used as the driver circuit SD.

Specifically, an integrated circuit formed over a silicon substrate can be used as the driver circuit SD.

For example, the driver circuit SD can be mounted on a terminal by a chip on glass (COG) method or a chip on film (COF) method. Specifically, an anisotropic conductive film can be used to mount an integrated circuit on the terminal.

A conductive material CP is sandwiched between the terminal 519C and the second electrode 752, and is configured to electrically connect the terminal 519C and the second electrode 752. For example, a conductive particle can be used as the conductive material CP.

The terminal 519B can be electrically connected to a flexible printed circuit using a conductive material ACF1, for example.

<Sensor Region>

The input portion 240 includes a sensor region 241, and the sensor region 241 includes a region overlapping with a display region 231 of the display portion 230 (see FIG. 12). The sensor region 241 has a function of sensing an object that approaches the region overlapping with the display region 231 (see FIG. 14A).

<Input Portion 240>

The input portion 240 includes the sensor region 241, an oscillator circuit OSC, and a sensor circuit DC (see FIG. 12).

The sensor region 241 includes a group of sensing elements 775(g, 1) to 775(g, q) and another group of sensing elements 775(1, h) to 775(p, h). Note that g is an integer greater than or equal to 1 and less than or equal to p, h is an integer greater than or equal to 1 and less than or equal to q, and each of p and q is an integer greater than or equal to 1.

The one group of sensing elements 775(g, 1) to 775(g, q) include a sensing element 775(g, h). The sensing elements 775(g, 1) to 775(g, q) are arranged in the row direction (indicated by an arrow R2 in the drawing). Note that the direction indicated by the arrow R2 in FIG. 12 may be the same as or different from the direction indicated by the arrow R1 in FIG. 12.

The another group of sensing elements 775(1, h) to 775(p, h) include the sensing element 775(g, h) and are provided in the column direction (the direction indicated by an arrow C2 in the drawing) that intersects with the row direction.

The one group of sensing elements 775(g, 1) to 775(g, q) provided in the row direction each include an electrode C(g) that is electrically connected to a control line CL(g) (see FIG. 13B2).

The another group of sensing elements 775(1, h) to 775(p, h) provided in the column direction include an electrode M(h) that is electrically connected to a sensor signal line ML(h).

The control line CL(g) includes a conductive film BR(g, h) (see FIG. 14A). The conductive film BR(g, h) includes a region overlapping with the sensor signal line ML(h).

The insulating film 706 includes a region located between the sensor signal line ML(h) and the conductive film BR(g, h). Thus, a short circuit between the sensor signal line ML(h) and the conductive film BR(g, h) can be prevented.

<Sensing Element 775(g, h)>

The sensing element 775(g, h) is electrically connected to the control line CL(g) and the sensor signal line ML(h).

The sensing element 775(g, h) has a light-transmitting property.

For example, a conductive film having an opening in a region overlapping with the pixel 702(i, j) can be used for the electrode C(g) and the sensor signal line ML(h). Accordingly, an object that approaches a region overlapping with the display panel can be sensed without disturbing display of the display panel. Furthermore, the thickness of the input/output device can be reduced. As a result, a novel input/output device that is highly convenient or reliable can be provided.

The electrode C(g) is electrically connected to the control line CL(g).

The electrode M(h) is electrically connected to the sensor signal line ML(h) and is positioned so that an electric field part of which is blocked by an object that approaches a region overlapping with the display panel is generated between the electrode M(h) and the electrode C(g).

The control line CL(g) has a function of supplying a control signal.

The sensor signal line ML(h) has a function of receiving the sensor signal.

The sensing element 775(g, h) has a function of supplying a sensor signal which changes in accordance with a control signal and a distance to an object that approaches a region overlapping with the display panel.

Thus, the object approaches the region overlapping with the display device can be sensed while the image data is displayed by the display device. As a result, a novel input/output device that is highly convenient or reliable can be provided.

<Oscillator Circuit OSC>

The oscillator circuit OSC is electrically connected to the control line CL(g) and has a function of supplying a control signal. For example, a rectangular wave, a sawtooth wave, or a triangular wave can be used for the control signal.

<Sensor Circuit DC>

The sensor circuit DC is electrically connected to the sensor signal line ML(h) and has a function of supplying a sensor signal on the basis of a change in the potential of the sensor signal line ML(h). Note that the sensor signal includes, for example, positional data.

<Input/Output Panel 700TP2>

The input/output panel 700TP2 includes a function layer 720 and a top-gate transistor.

<Function Layer 720>

The function layer 720 includes, for example, the control line CL(g), the sensor signal line ML(h), and the sensing element 775(g, h).

The gap between the control line CL(g) and the second electrode 752 or between the sensor signal line ML(h) and the second electrode 752 is greater than or equal to 0.2 μm and less than or equal to 16 μm, preferably greater than or equal to 1 μm and less than or equal to 8 μm, further preferably greater than or equal to 2.5 μm and less than or equal to 4 μm.

<Conductive Film 511D>

The input/output panel 700TP2 described in this embodiment includes a conductive film 511D (see FIG. 15).

Note that the conductive material CP or the like can be provided between the control line CL(g) and the conductive film 511D to electrically connect the control line CL(g) and the conductive film 511D. Alternatively, the conductive material CP or the like can be provided between the sensor signal line ML(h) and the conductive film 511D to electrically connect the sensor signal line ML(h) and the conductive film 511D. A material that can be used for the wiring or the like can be used for the conductive film 511D, for example.

<Light-reflective Film 750R>

The input/output panel 700TP2 described in this embodiment includes the light-reflective film 750R (see FIGS. 14A and 14B). A material having light reflectivity can be used for the light-reflective film 750R.

In the structure of the input/output panel 700TP2 illustrated in FIG. 15, in a process from entry of external light into the panel to reflection of the external light at the light-reflective film 750R, the light passes through the coloring film CF1 twice, i.e., before the light reaches the light-reflective film 750R and after the light is reflected at the light-reflective film 750R.

<Terminal and the Like>

The input/output panel 700TP2 described in this embodiment includes the terminal 519C and a terminal 519D.

The terminal 519C includes a conductive film 511C and an intermediate film 754C. The conductive film 511C is electrically connected to a wiring VCOM1, for example.

The terminal 519D is electrically connected to the conductive film 511D. The terminal 519D is provided with the conductive film 511D and an intermediate film 754D, and the intermediate film 754D includes a region in contact with the conductive film 511D.

A conductive material can be used for the intermediate films 754C and 754D. A light-transmitting material can be used for the intermediate films. For example, a material containing indium and oxygen, a material containing indium, gallium, zinc, and oxygen, a material containing indium, tin, and oxygen, or the like can be used for the intermediate films. Specifically, 50- or 100-nm-thick films containing indium, gallium, zinc, and oxygen can be used as the intermediate films. Note that these materials have a function of allowing the passage of hydrogen.

A material that can be used for the wiring or the like can be used for the terminal 519D, for example. Specifically, the terminal 519D can have the same structure as the terminal 519B or the terminal 519C (see FIG. 15).

Note that the terminal 519D can be electrically connected to the flexible printed circuit FPC2 using a conductive material ACF2, for example. Accordingly, a control signal can be supplied to the control line CL(g) using the terminal 519D, or a sensor signal can be supplied from the sensor signal line ML(h) using the terminal 519D, for example.

<Switch SW1, Transistor M, Transistor MD>

A transistor that can be used as a switch SW1, the transistor M, and a transistor MD each include the conductive film 504 having a region overlapping with the insulating layer 501C and the semiconductor film 508 having a region located between the insulating layer 501C and the conductive film 504. Note that the conductive film 504 functions as a gate electrode (see FIG. 14B).

The semiconductor film 508 includes the first region 508A, the second region 508B, and the third region 508C. The first region 508A and the second region 508B do not overlap with the conductive film 504. The third region 508C is positioned between the first region 508A and the second region 508B and overlaps with the conductive film 504.

The transistor MD includes the insulating layer 506 between the third region 508C and the conductive film 504. Note that the insulating layer 506 functions as a gate insulating film.

The first region 508A and the second region 508B have a lower resistivity than the third region 508C, and function as a source region and a drain region.

The first region 508A and the second region 508B can be formed in the semiconductor film 508 by, for example, performing plasma treatment on the metal oxide film using a gas containing a rare gas.

The conductive film 504 can be used as a mask, for example, in which case part of the third region 508C can be self-aligned to an end portion of the conductive film 504.

The transistor MD includes the conductive layer 512A and the conductive layer 512B that are in contact with the first region 508A and the second region 508B, respectively. The conductive layer 512A and the conductive layer 512B function as a source electrode and a drain electrode.

For example, a transistor that can be fabricated in the same process as the transistor MD can be used as the transistor M.

The display device including a touch sensor manufactured in such a manner can be combined with one or more of a keyboard, a hardware button, a pointing device, an illuminance sensor, an imaging device, an audio input device, a viewpoint input device, and a pose detection device to form a semiconductor device.

Note that this embodiment can be combined with any of the other embodiments in this specification as appropriate.
(Embodiment 6)

In this embodiment, a light-emitting element which can be used for a semiconductor device of one embodiment of the present invention, specifically the layer $553(i,j)$ containing the organic compound, will be described with reference to FIG. 16.
<Structure Example of Light-emitting Element>

First, the structure of a light-emitting element which can be used for a semiconductor device of one embodiment of the present invention will be described with reference to FIG. 16. FIG. 16 is a cross-sectional view of the light-emitting element 160.

Note that one or both of an inorganic compound and an organic compound can be used for the light-emitting element 160. As the organic compound used for the light-emitting element 160, a low molecular compound or a high molecular compound can be used. The high molecular compound is preferable because it is thermally stable and can easily form a thin film with excellent uniformity by a coating method or the like.

Figure 16:
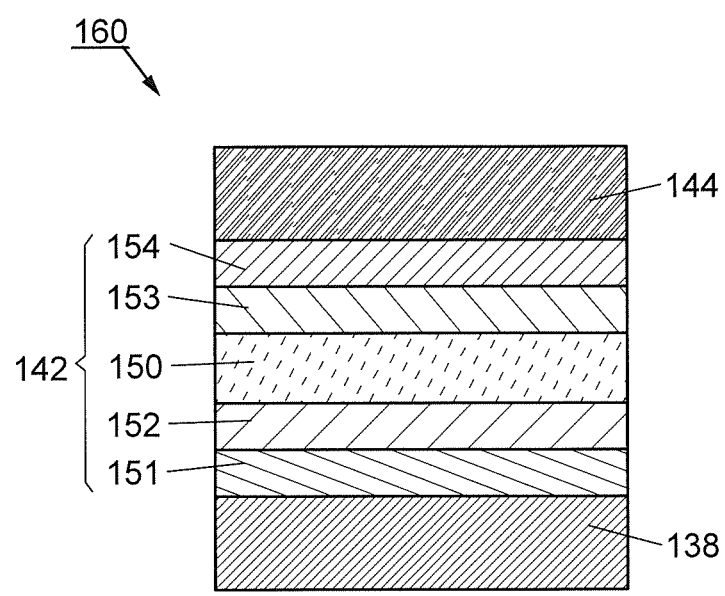
FIG. 16 illustrates a light-emitting element in one embodiment.

The light-emitting element 160 shown in FIG. 16 includes a pair of electrodes (the conductive film 138 and the conductive film 144) and the EL layer 142 between the pair of electrodes. The EL layer 142 includes at least a light-emitting layer 150.

The EL layer 142 illustrated in FIG. 16 includes functional layers such as a hole-injection layer 151, a hole-transport layer 152, an electron-transport layer 153, and an electron-injection layer 154, in addition to the light-emitting layer 150.

In this embodiment, although description is given assuming that the conductive film 138 and the conductive film 144 of the pair of electrodes serve as an anode and a cathode, respectively, they are not limited thereto for the structure of the light-emitting element 160. That is, the conductive film 138 may be a cathode, the conductive film 144 may be an anode, and the stacking order of the layers between the electrodes may be reversed. In other words, the hole-injection layer 151, the hole-transport layer 152, the light-emitting layer 150, the electron-transport layer 153, and the electron-injection layer 154 may be stacked in this order from the anode side.

The structure of the EL layer 142 is not limited to the structure illustrated in FIG. 16, and a structure including at least one layer selected from the hole-injection layer 151, the hole-transport layer 152, the electron-transport layer 153, and the electron-injection layer 154 may be employed in addition to the light-emitting layer 150. Alternatively, the EL layer 142 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

A low molecular compound or a high molecular compound can be used for the light-emitting layer 150.

In this specification and the like, a high molecular compound is a polymer which has molecular weight distribution and whose average molecular weight is $1\times10^3$ to $1\times10^8$. A low molecular compound is a compound which does not have molecular weight distribution and whose molecular weight is less than or equal to $1\times10^4$.

In addition, the high molecular compound is a compound in which one or a plurality of structural units are polymerized. That is, the structural unit refers to a unit included in the high molecular compound and the number of the units is one or more.

In addition, the high molecular compound may be any of a block copolymer, a random copolymer, an alternating copolymer, a graft copolymer, and the like.

In the case where an end group of the high molecular compound includes a polymerization active group, light emission characteristics or luminance lifetime of the light-emitting element may be reduced. Thus, the end group of the high molecular compound is preferably a stable end group. As the stable end group, a group which is covalently bonded to a main chain is preferable, and a group which is bonded to an aryl group or a heterocycle group through a carbon-carbon bond is particularly preferable.

When the low molecular compound is used for the light-emitting layer 150, a light-emitting low molecular compound is preferably contained as a guest material in addition to a low molecular compound serving as a host material. In the light-emitting layer 150, the weight percentage of the host material is larger than that of the guest material, and the guest material is dispersed in the host material.

A light-emitting organic compound can be used as the guest material. A substance capable of emitting fluorescence (hereinafter also referred to as a fluorescent compound) or capable of emitting phosphorescence (hereinafter also referred to as a phosphorescent compound) can be used as the light-emitting organic compound.

In the light-emitting element 160 of one embodiment of the present invention, voltage application between a pair of electrodes (the conductive film 138 and the conductive film 144) causes electrons and holes to be injected from the cathode and the anode, respectively, into the EL layer 142, whereby a current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. Accordingly, in a light-emitting element that contains a fluorescent compound, the probability of generation of singlet excitons, which contribute to light emission, is 25% and the probability of generation of triplet excitons, which do not contribute to light emission, is 75%. In the light-emitting element containing a phosphorescent compound, both of the singlet excitons and triplet excitons can contribute to light emission. Therefore, a light-emitting element containing a phosphorescent compound has higher light emission efficiency than a light-emitting element containing a fluorescent compound and thus is preferable.

Note that the term "exciton" refers to a carrier (electron and hole) pair. Since excitons have energy, a material where excitons are generated is brought into an excited state.

When a high molecular compound is used for the light-emitting layer 150, it is preferable that the high molecular compound include, as its constituent unit, a skeleton having a function of transporting holes (a hole-transport property) and a skeleton having a function of transporting electrons (an electron-transport property). Alternatively, it is preferable that the high molecular compound include a π-electron deficient heteroaromatic skeleton and at least one of a π-electron rich heteroaromatic skeleton and an aromatic amine skeleton. The skeletons are bonded to each other directly or through another skeleton.

In the case where the high molecular compound includes the skeleton having a hole-transport property and the skeleton having an electron-transport property, the carrier balance can be easily controlled. As a result, a carrier recombination region can also be controlled easily. In order to achieve this, it is preferable that the composition ratio of the skeleton having a hole-transport property to the skeleton having an electron-transport property be in the range of 1:9 to 9:1 (molar ratio), and it is further preferable that the proportion of the skeleton having an electron-transport property be higher than the proportion of the skeleton having a hole-transport property.

The high molecular compound may include, as its constituent unit, a light-emitting skeleton, in addition to the skeleton having a hole-transport property and the skeleton having an electron-transport property. When the high molecular compound includes a light-emitting skeleton, the composition ratio of the light-emitting skeleton to all the constituent units of the high molecular compound is preferably low, specifically higher than or equal to 0.1 mol % and lower than or equal to 10 mol %, further preferably higher than or equal to 0.1 mol % and lower than or equal to 5 mol %.

Note that the constituent units of the high molecular compound used for the light-emitting element 160 may have different bonding directions, bonding angles, bonding lengths, and the like. In addition, the constituent units may have different substituents, and may have different skeletons therebetween. In addition, the polymerization methods of constituent units may differ.

The light-emitting layer 150 may include a light-emitting low molecular compound as a guest material, in addition to the high molecular compound serving as a host material. In that case, the light-emitting low molecular compound is dispersed as a guest material into the high molecular compound serving as a host material, and the weight percentage of the high molecular compound is higher than that of at least the light-emitting low molecular compound. The weight percentage of the light-emitting low molecular compound to the high molecular compound is preferably higher than or equal to 0.1 wt % and lower than or equal to 10 wt %, further preferably higher than or equal to 0.1 wt % and lower than or equal to 5 wt %.

A light-emitting element having high emission efficiency which is obtained in such a manner is used for a display device of one embodiment of the present invention, whereby, images displayed by the display device can be perceived without suffering polarization caused by a liquid crystal layer, i.e., the display device can have high visibility.

The structure described in this embodiment can be combined with any of the structures described in the other embodiments as appropriate.

(Embodiment 7)

Described below is a semiconductor layer applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, a metal oxide having at least one of an amplification function, a rectification function, and a switching function can be referred to as a metal oxide semiconductor (abbreviated to an OS). That is, an OS FET is a transistor including a metal oxide or an oxide semiconductor.

In this specification and the like, a metal oxide including nitrogen is also referred to as a metal oxide in some cases. Alternatively, a metal oxide including nitrogen may be referred to as a metal oxynitride.

In this specification and the like, "c-axis aligned crystal (CAAC)" or "cloud-aligned composite (CAC)" may be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

Described below is the composition of a cloud-aligned composite oxide semiconductor (CAC-OS) applicable to a transistor disclosed in one embodiment of the present invention.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plane direction and the cross-sectional direction.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility GO can be achieved.

A semiconductor element including a CAC-OS has high reliability. Thus, the CAC-OS is suitably used in a variety of semiconductor devices typified by a display.

By using such a semiconductor element having high field-effect mobility for a display device of one embodiment of the present invention, a novel display device that achieves both higher visibility and higher definition can be manufactured.

At least part of this embodiment can be implemented in combination with any of the other embodiments described in this specification as appropriate.

(Embodiment 8)

Figure 20A:
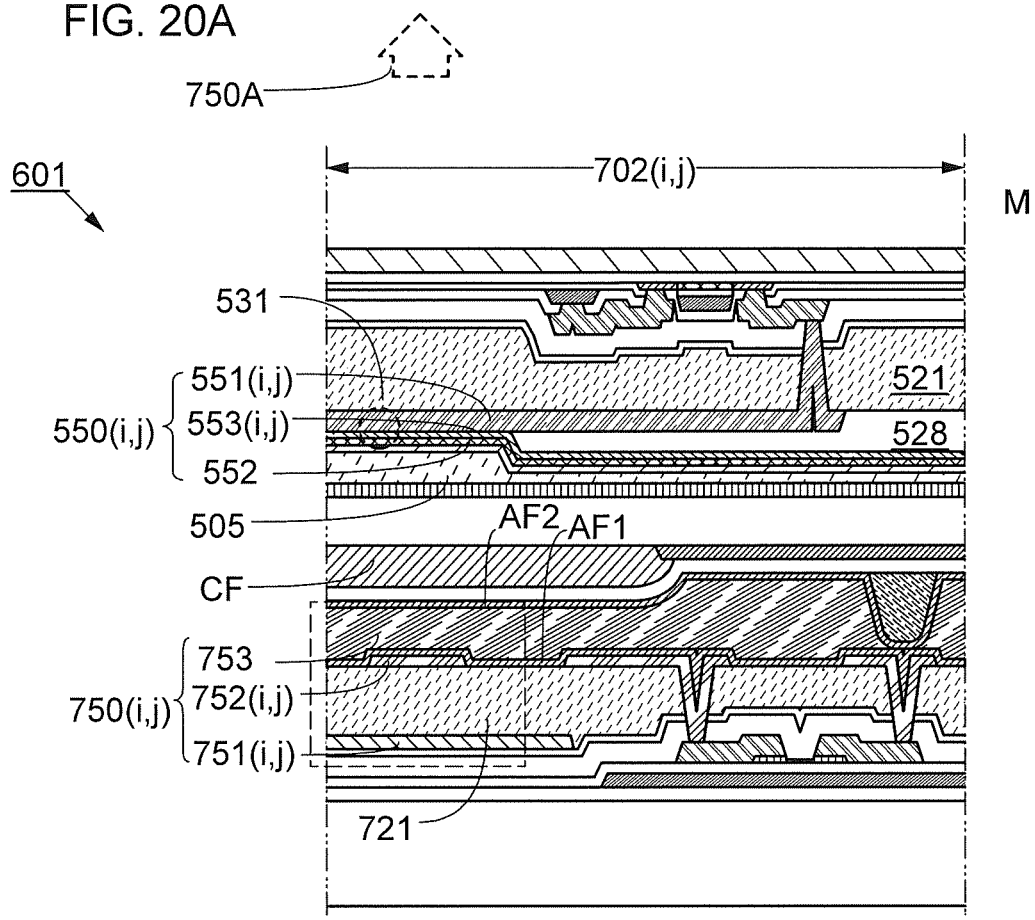
FIGS. 20A to 20E illustrate stacked-layer structures of conductive films and insulating films in one embodiment.
Figure 20B:
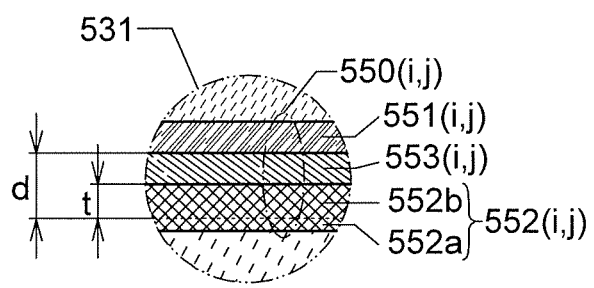

In this embodiment, with reference to FIGS. 20A to 20E, an example will be described in which conductive films or insulating films which can be used for a semiconductor device of one embodiment of the present invention have a stacked structure and are formed using a semi-light-transmitting material to increase the color purity; thus, a display device having favorable color reproducibility is provided. FIG. 20A illustrates the structure body 601 that is illustrated in FIGS. 2A to 2C. FIG. 20B is an enlarged view of a portion 531 in FIG. 20A.

In the case where the light-emitting element (self-luminous display element) has a microcavity structure, the third electrode 551($i, j$) is formed using a conductive material (a semi-transmissive material) which transmits and reflects a certain amount of light of the incident light, and the fourth electrode 552 is formed using a stack of a conductive material having high reflectance (the reflectance of visible light is 50% or more and 100% or less, preferably 70% or more and 100% or less) and a conductive material having high transmittance (the transmittance of visible light is 50% or more and 100% or less, preferably 70% or more and 100% or less). Here, the fourth electrode 552 is formed of a stack of a fourth electrode 552a formed using a conductive material that reflects light and a fourth electrode 552b formed using a conductive material that transmits light. The fourth electrode 552b is provided between the layer 553($i, j$) containing the organic compound and the fourth electrode 552a (see FIG. 20B). The third electrode 551($i, j$) functions as a semi-reflective electrode, and the fourth electrode 552a functions as a reflective electrode.

For example, the third electrode 551($i, j$) may be formed using a conductive material containing silver (Ag) or a conductive material containing aluminum (Al) having a thickness of 1 nm to 30 nm, preferably 1 nm to 15 nm. In this embodiment, as the third electrode 551($i, j$), a 10-nm-thick conductive material containing silver and magnesium is used.

The fourth electrode 552a may be formed using a conductive material containing silver (Ag) or a conductive material containing aluminum (Al) having a thickness of 50 nm to 500 nm, preferably 50 nm to 200 nm. In this embodiment, the fourth electrode 552a is formed using a 100-nm-thick conductive material containing silver.

For the fourth electrode 552b, a conductive oxide containing indium (In) or a conductive oxide containing zinc (Zn) having a thickness of 1 nm to 200 nm, preferably 5 nm to 100 nm may be used. In this embodiment, indium tin oxide is used for the fourth electrode 552b. Furthermore, a conductive oxide may be provided under the fourth electrode 552a.

By changing the thickness t of the fourth electrode 552b, an optical distance d from the interface between the third electrode 551($i, j$) and the layer 553($i, j$) containing the organic compound to the interface between the fourth electrode 552a and the fourth electrode 552b can be set to an arbitral value. Light-emitting elements having different emission spectra for respective pixels can be provided even when one layer 553($i, j$) containing an organic compound is used by changing the thickness t of the fourth electrode 552b in each pixel. Thus, color purity of each emission color is improved and a display device having favorable color reproducibility can be achieved. It is not necessary to independently form the layer 553($i, j$) containing the organic compound in each pixel depending on the emission color; therefore, the number of manufacturing steps of the display device can be reduced and thus the productivity can be improved. Furthermore, a high-definition display device can be achieved easily.

Note that a method for adjusting the optical distance d is not limited to the above method. For example, the optical distance d may be adjusted by changing the film thickness of the layer 553($i, j$) containing the organic compound.

Figure 20C:
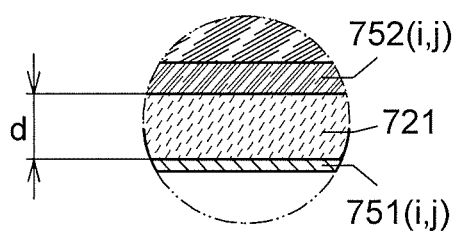

Alternatively, the second electrode 752($i, j$) may be formed using a semi-transmissive material (semi-light-transmitting material), the first electrode 751($i, j$) may be formed using a material having high reflectance, and the optical distance d may be adjusted by changing the film thickness of the insulating film 721 (see FIG. 20C).

Figure 20D:
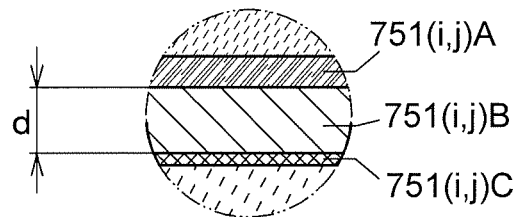
Figure 20E:
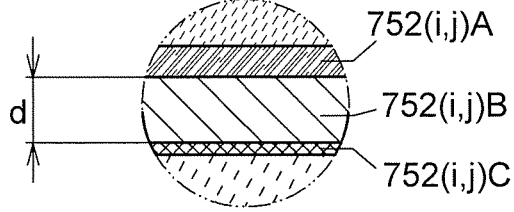

Alternatively, the first electrode 751($i, j$) may include a first electrode 751($i, j$)A formed using a semi-transmissive material, a first electrode 751($i, j$)B formed using a material having high transmittance, and a first electrode 751($i, j$)C formed using high reflectance, and the optical distance d may be adjusted by changing the film thickness of the first electrode 751($i, j$)B (see FIG. 20D). Alternatively, the second electrode 752($i, j$) may include a second electrode 752($i, j$)A formed using a semi-transmissive material, a second electrode 752($i, j$)B formed using high transmittance, and a second electrode 752($i, j$)C formed using a material having high reflectance, and the optical distance d may be adjusted by changing the film thickness of the second electrode 752($i, j$)B (see FIG. 20E).

A structure may be employed in which the coloring film CF is provided in a position overlapping with the second display element 550($i, j$) and light from the second display element 550($i, j$) passes through the coloring film CF and is emitted to the outside.

With such a structure, a microcavity structure can be formed by a combination of a self-luminous display element, the first electrode 751($i, j$), and the second electrode 752($i, j$), and the color purity of each color can be adjusted with a high degree of freedom. With such a structure, the visibility of the display device can be increased. According to one embodiment of the present invention, a display device which is hardly affected by polarization and has high color purity and favorable display quality can be provided.

(Embodiment 9)

In this embodiment, a structure of a touch sensor is described as the display device of one embodiment of the present invention. A display module in which an electrode of a touch sensor is incorporated separately from a display device is also called an out-cell touch panel (or a display device with an out-cell touch sensor) in some cases.

A touch panel refers to a display device (or a display module) provided with a touch sensor. In some cases, a touch panel is called a touch screen. Furthermore, a device which does not include a display device and includes only a touch sensor is called a touch panel in some cases. A display device that is provided with a touch sensor is also called a touch sensor equipped display device, a display device equipped touch panel, a display module, or the like in some cases.

A display device in which an electrode of a touch sensor is incorporated on the element substrate side is called a full in-cell touch panel (or a full in-cell touch sensor equipped display device), in some cases. In the full in-cell touch panel, for example, an electrode formed on the element substrate side is also used as an electrode for the touch sensor.

A display device in which an electrode of a touch sensor is incorporated on the counter substrate side as well as on the element substrate side is called a hybrid in-cell touch panel (or a hybrid in-cell touch sensor equipped display device). The hybrid in-cell touch panel uses an electrode formed on the element substrate side and an electrode formed on the counter substrate side as electrodes for a touch sensor, for example.

A display device in which an electrode of a touch sensor is incorporated on the counter substrate side is called an on-cell touch panel (or an on-cell touch sensor equipped display device), in some cases. The on-cell touch panel uses an electrode formed on the counter substrate side also as an electrode for a touch sensor, for example.

Figure 21:
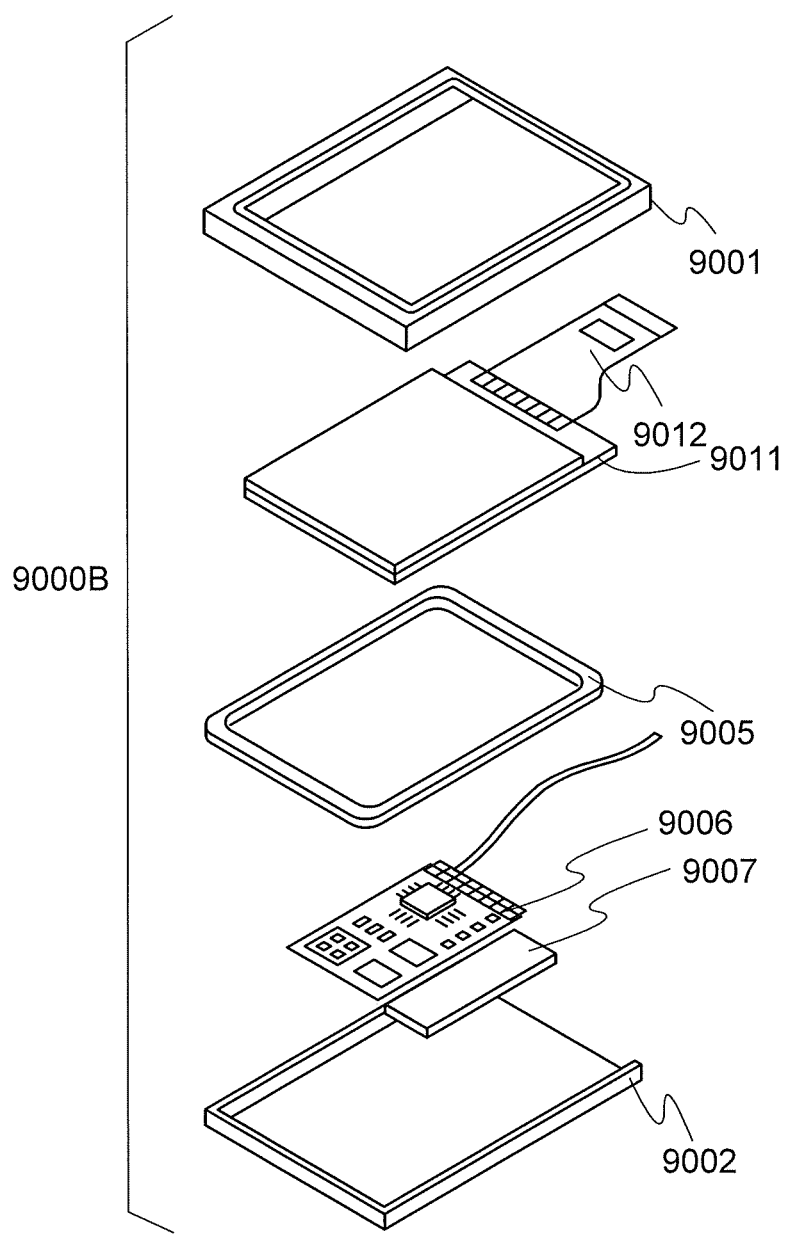
FIG. 21 illustrates a structure of an input/output panel that can be used in an input/output device in one embodiment.

FIG. 21 illustrates a display module 9000B including a touch panel in which a display device has a touch sensor function, like the above full in-cell, hybrid in-cell, or on-cell touch panel. In the display module 9000B, a touch panel 9011 connected to an FPC 9012, a frame 9005, a printed board 9006, and a battery 9007 are provided between an upper cover 9001 and a lower cover 9002. In the case where a display element in the touch panel 9011 is a liquid crystal element, a backlight unit or the like may also be provided.

The semiconductor device described in the above embodiment can be used for a display device or a touch panel. Accordingly, the frames of the display modules 9000A and 9000B can be narrower, and the image qualities thereof can be improved.

The shapes and sizes of the upper cover 9001 and the lower cover 9002 can be changed as appropriate in accordance with the size of the display device 9004, the touch panel 9011, or the like.

For the touch sensor 9010 and the touch panel 9011, a resistive or capacitive touch sensor can be used.

The frame 9005 protects the display device 9004, the touch panel 9011, or the like and functions as an electromagnetic shield for blocking electromagnetic waves generated by the operation of the printed board 9006. The frame 9005 can also function as a radiator plate.

The printed board 9006 includes circuits for outputting a variety of signals for driving the display device 9004, the touch panel 9011, or the like. As a power source for supplying power to the circuits on the printed board 9006, an external commercial power source or a power source using the battery 9007 provided separately may be used. The battery 9007 can be omitted in the case of using a commercial power source.

Each of the display modules 9000A and 9000B can be additionally provided with a component such as a polarizing plate, a retardation plate, or a prism sheet.

Figure 22A:
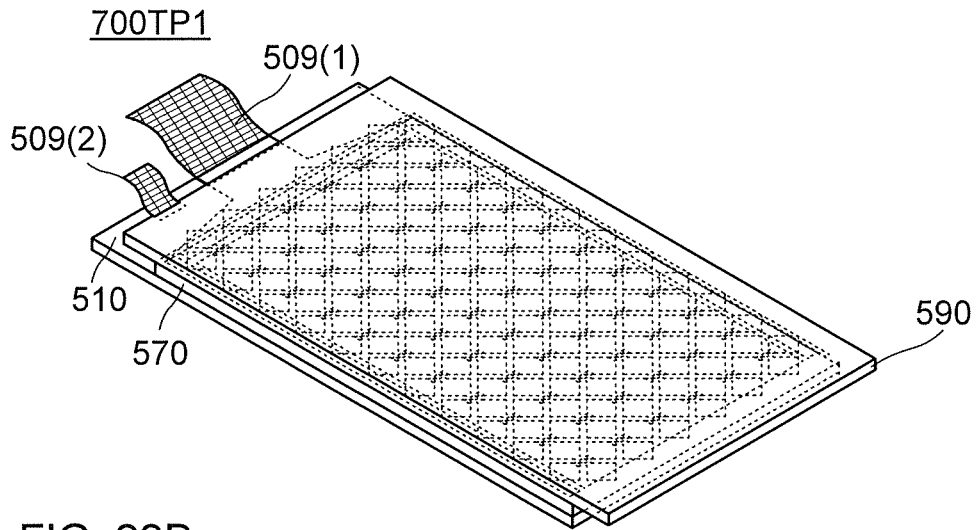
FIGS. 22A and 22B illustrate a structure of an input/output panel that can be used in an input/output device in one embodiment.
Figure 22B:
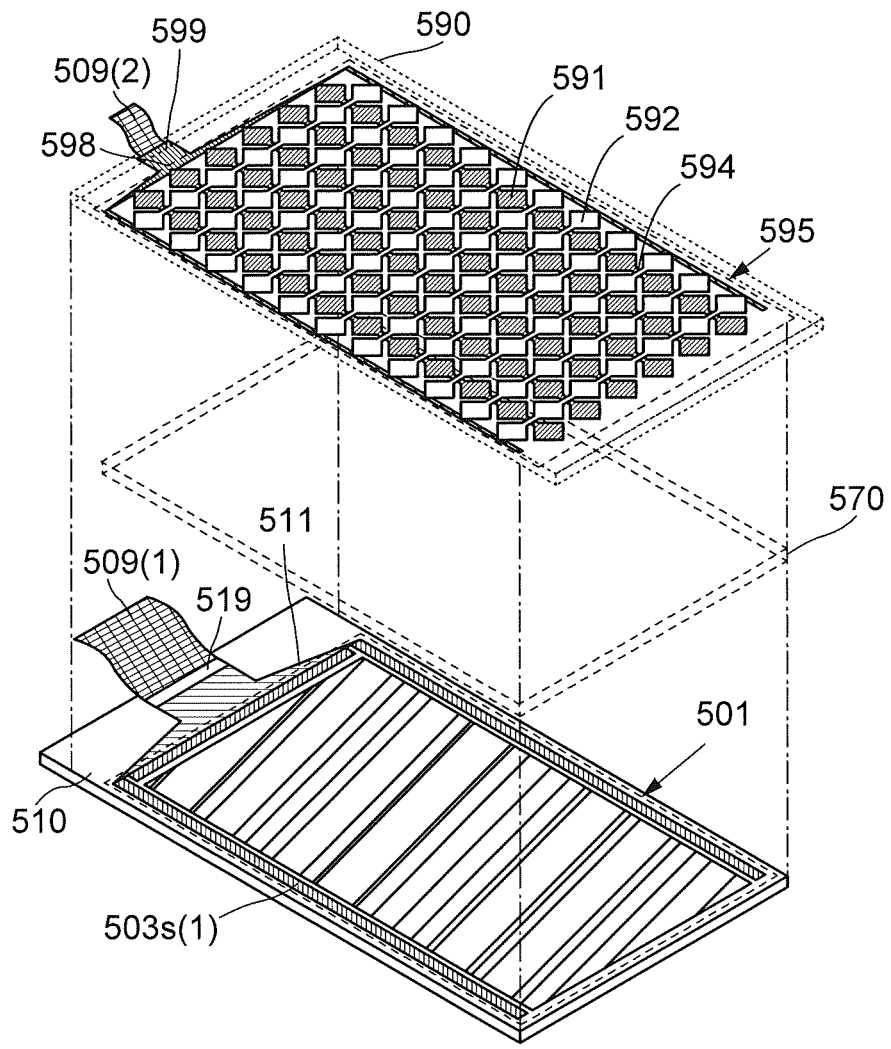

As illustrated in FIGS. 22A and 22B, a touch panel and the display device of one embodiment of the present invention may be attached to each other.

An input/output panel 700TP1 includes a display portion 501 and a touch sensor 595 (see FIG. 22B). The input/output panel 700TP1 further includes a substrate 510, the substrate 570, and a substrate 590.

The substrates 510 and 570 are provided with a pixel circuit and light-emitting elements (e.g., first light-emitting elements) and have already bonded to each other by the manufacturing method described in Embodiment 3. The substrate 590 is provided with a touch sensor. In other words, the substrate 590 is bonded to the substrates 510 and 570 to manufacture the input/output panel 700TP1. After the bonding, by separating the touch sensor from the substrate 590 or reducing the thickness of the substrate 590 in such a structure, the thickness of the input/output panel 700TP1 can be reduced.

The display portion 501 includes the substrate 510, a plurality of pixels over the substrate 510, a plurality of wirings 511 through which signals are supplied to the pixels, and an image signal line driver circuit 503$s$(1). The plurality of wirings 511 are led to a peripheral portion of the substrate 510, and parts of the plurality of wirings 511 form a terminal 519. The terminal 519 is electrically connected to an FPC 509(1).

<Touch Sensor>

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 22B, electrodes, wirings, and the like of the touch sensor 595 provided on the back side of the substrate 590 (the side facing the substrate 510) are indicated by solid lines for clarity.

As the touch sensor 595, for example, a capacitive touch sensor can be used. Examples of the capacitive touch sensor include a surface capacitive touch sensor and a projected capacitive touch sensor.

Examples of the projected capacitive touch sensor include a self-capacitive touch sensor and a mutual capacitive touch sensor, which differ mainly in the driving method. The use of a mutual capacitive type is preferred because multiple points can be sensed simultaneously.

An example of using a projected capacitive touch sensor will be described below with reference to FIG. 22B.

Note that a variety of sensors that can sense the closeness or the contact of a sensing target such as a finger can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 22A and 22B.

The electrodes 591 each have a quadrangular shape and are arranged in a direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 is reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode that is electrically insulated from these electrodes, whereby the area of a region having a different transmittance can be reduced.

A connection layer 599 electrically connects the wiring 598 to the FPC 509(2). As the connection layer 599, any of a variety of anisotropic conductive films (ACF), anisotropic conductive pastes (ACP), and the like can be used.

Note that this embodiment can be combined with any of the other embodiments in this specification as appropriate.

(Embodiment 10)

In this embodiment, electronic devices and lighting devices of embodiments of the present invention will be described with reference to drawings.

Electronic devices and lighting devices can be manufactured by using the display device of one embodiment of the present invention. Flexible electronic devices and flexible lighting devices can be manufactured by using a flexible substrate for the display device of one embodiment of the present invention.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, information, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

FIGS. 17A to 17E illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device or the like of one embodiment of the present invention. One embodiment of the present invention makes it possible to provide a highly reliable electronic device having a curved display portion.

Figure 17A:
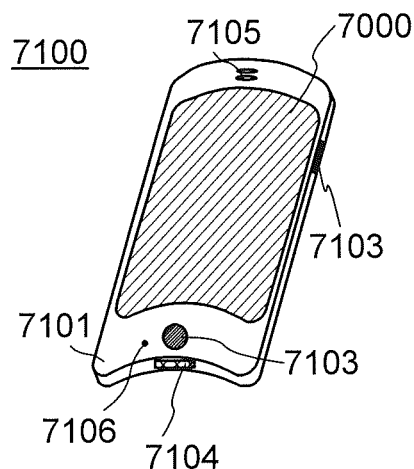
FIGS. 17A to 17F illustrate examples of electronic devices and a lighting device in one embodiment.
Figure 17B:
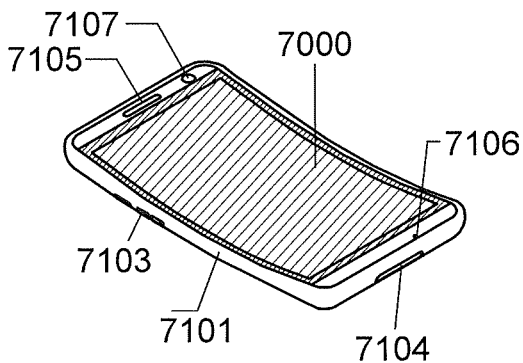

FIGS. 17A and 17B illustrate examples of mobile phones. A mobile phone 7100 illustrated in FIG. 17A and a mobile phone 7110 illustrated in FIG. 17B each include a housing 7101, the display portion 7000, operation buttons 7103, an external connection port 7104, a speaker 7105, a microphone 7106, and the like. The mobile phone 7110 illustrated in FIG. 17B also includes a camera 7107.

Each mobile phone includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 17C:
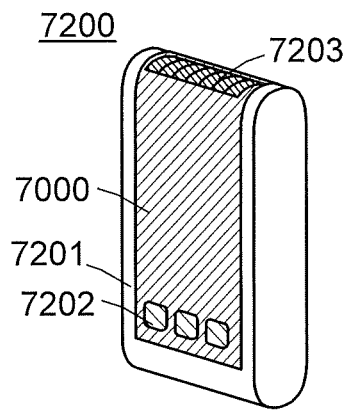
Figure 17D:
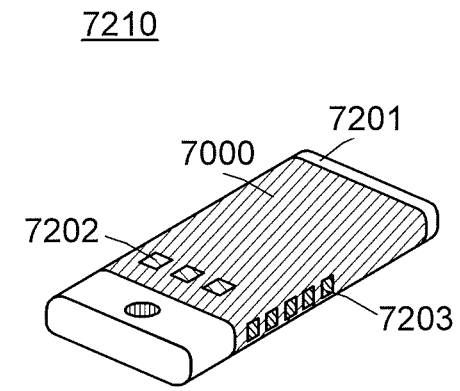

FIGS. 17C and 17D illustrate examples of portable information terminals. A portable information terminal 7200 illustrated in FIG. 17C and a portable information terminal 7210 illustrated in FIG. 17D each include a housing 7201 and the display portion 7000. Each of the portable information terminals may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7200 and 7210 can display characters, image information, and the like on its plurality of surfaces. For example, as illustrated in FIGS. 17C and 17D, three operation buttons 7202 can be displayed on one surface, and information 7203 indicated by a rectangle can be displayed on another surface. FIG. 17C illustrates an example in which information is displayed at the top of the portable information terminal. FIG. 17D illustrates an example in which information is displayed on the side of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 17E:
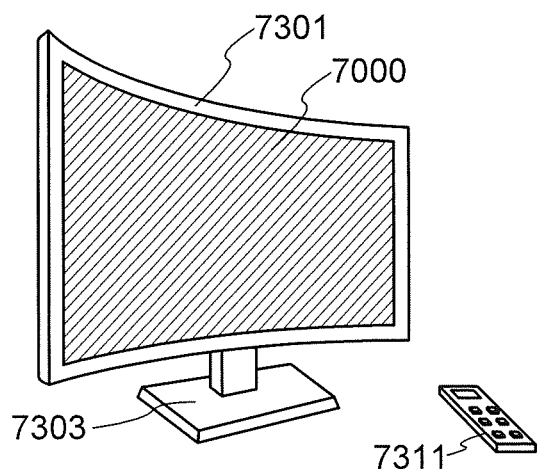

FIG. 17E illustrates an example of a television set. In a television set 7300, the display portion 7000 is incorporated into a housing 7301. Here, the housing 7301 is supported by a stand 7303.

The television set 7300 illustrated in FIG. 17E can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and a video displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 17F:
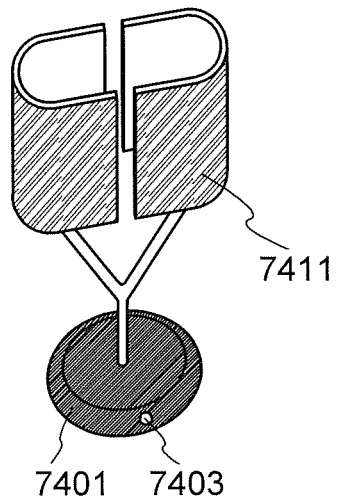

FIG. 17F illustrates an example of a lighting device having a curved light-emitting portion.

The light-emitting portion included in the lighting device illustrated in FIG. 17F can be manufactured using the display device or the like of one embodiment of the present invention. According to one embodiment of the present invention, a highly reliable lighting device having a curved light-emitting portion can be provided.

A light-emitting portion 7411 included in a lighting device 7400 illustrated in FIG. 17F has two convex-curved light-emitting portions symmetrically placed. Thus, all directions can be illuminated with the lighting device 7400 as a center.

The light-emitting portion included in the lighting device 7400 may have flexibility. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and the light-emitting portion 7411 supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 18A to 18I illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

Figure 18A:
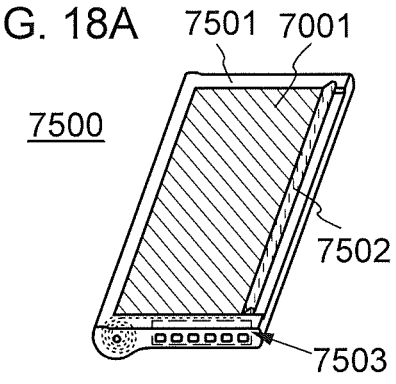
FIGS. 18A to 18I illustrate examples of electronic devices in one embodiment.
Figure 18B:
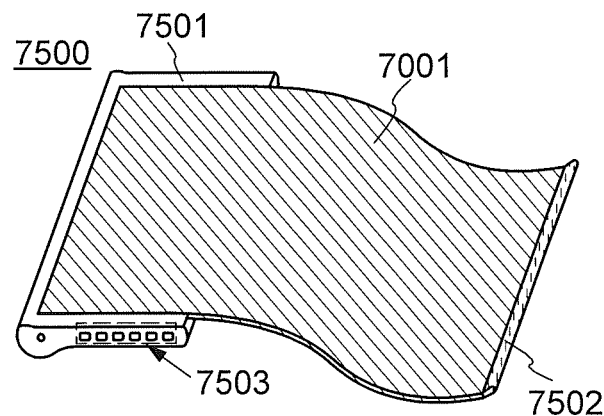

FIGS. 18A and 18B are perspective views illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out by using the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed videos, and the like can be performed. Although FIGS. 18A and 18B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 18B illustrates the portable information terminal 7500 in a state where the display portion 7001 is pulled out. Videos can be displayed on the display portion 7001 in this state. In addition, the portable information terminal 7500 may perform different displays in the state where part of the display portion 7001 is rolled as shown in FIG. 18A and in the state where the display portion 7001 is pulled out as shown in FIG. 18B. For example, in the state shown in FIG. 18A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figure 18C:
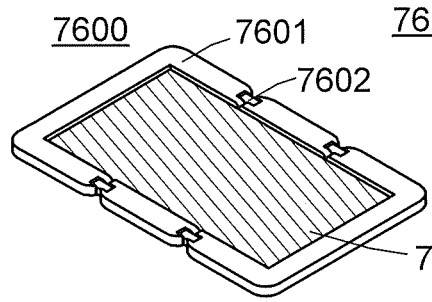
Figure 18D:
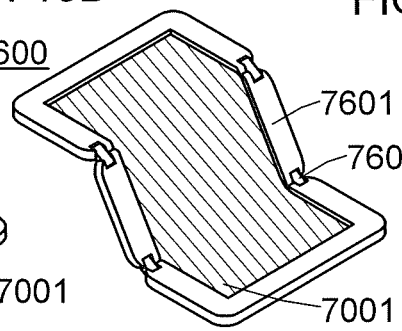
Figure 18E:
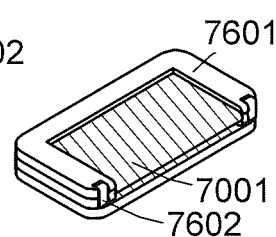

FIGS. 18C to 18E illustrate an example of a foldable portable information terminal. FIG. 18C illustrates a portable information terminal 7600 that is opened. FIG. 18D illustrates the portable information terminal 7600 that is being opened or being folded. FIG. 18E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

Figure 18F:
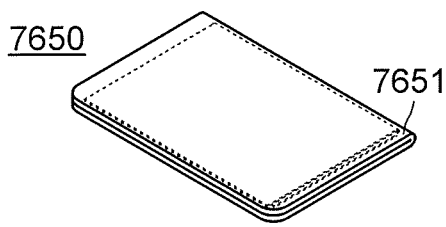
Figure 18G:
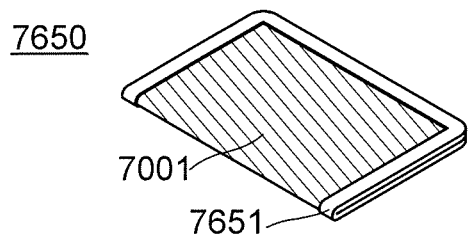

FIGS. 18F and 18G illustrate an example of a foldable portable information terminal. FIG. 18F illustrates a portable information terminal 7650 that is folded so that the display portion 7001 is on the inside. FIG. 18G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

Figure 18H:
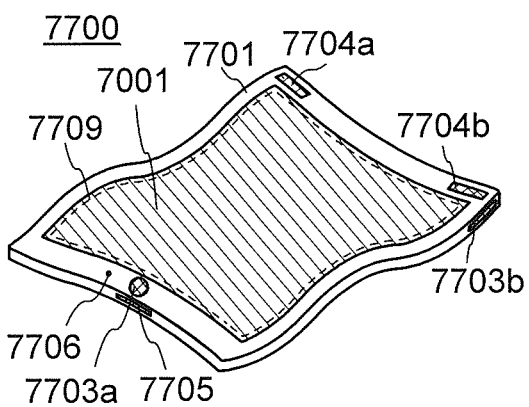

FIG. 18H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 18I:
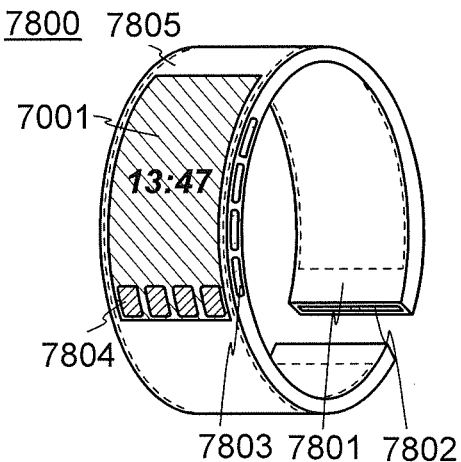

FIG. 18I illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 19A:
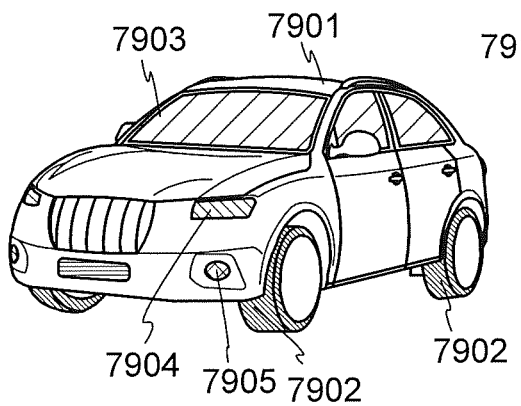
FIGS. 19A to 19F illustrate examples of electronic devices in one embodiment.
Figure 19B:
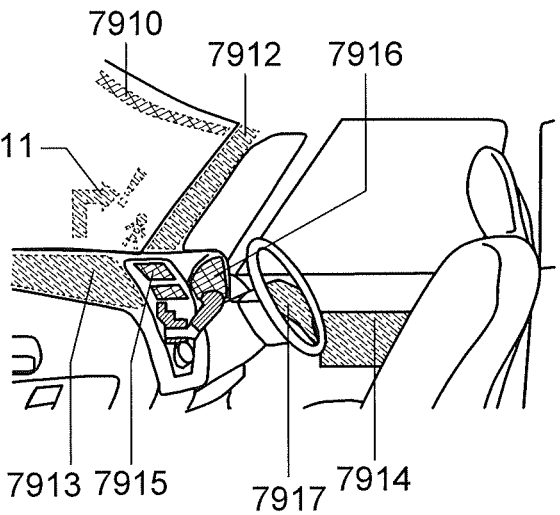

FIG. 19A is an external view of an automobile 7900. FIG. 19B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 19B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using a metal oxide, is preferably used.

A display portion 7912 is provided on a pillar portion. A display portion 7913 is provided on a dashboard. For example, the display portion 7912 can compensate for the view hindered by the pillar portion by showing an image taken by an imaging unit provided on the car body. Similarly, the display portion 7913 can compensate for the view hindered by the dashboard and a display portion 7914 can compensate for the view hindered by the door. That is, showing a video taken by an imaging unit provided on the outside of the automobile leads to elimination of blind areas and enhancement of safety. In addition, showing a video so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 19C:
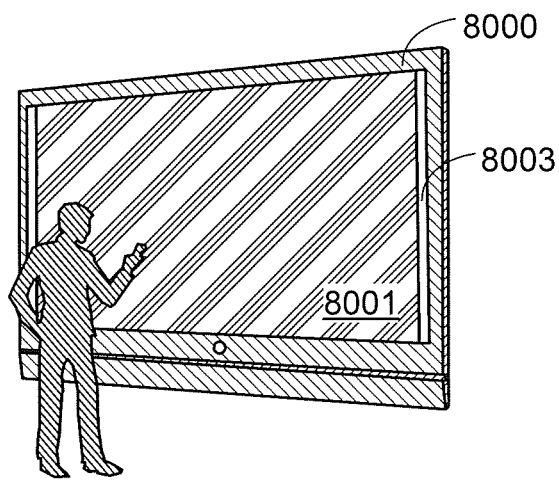
Figure 19D:
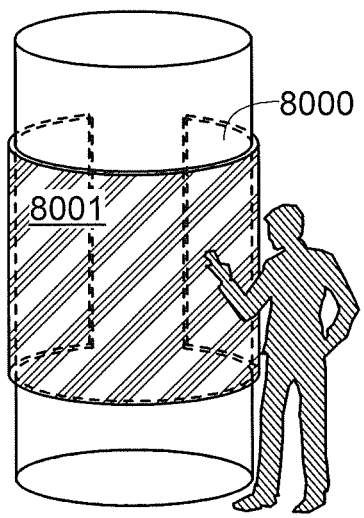

FIGS. 19C and 19D illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 19D illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Figure 19E:
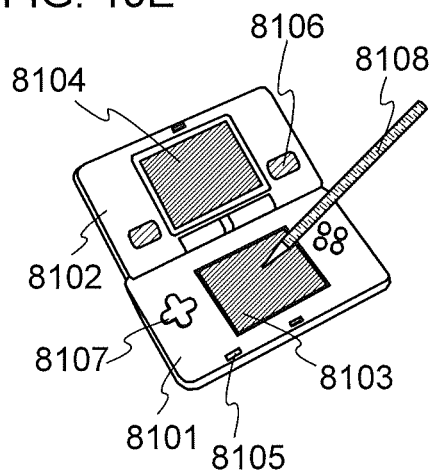

FIG. 19E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 19E includes two display portions 8103 and 8104. Note that the number of display portions of an electronic device of one embodiment of the present invention is not limited to two and can be one or three or more as long as at least one display portion includes the display device of one embodiment of the present invention.

Figure 19F:
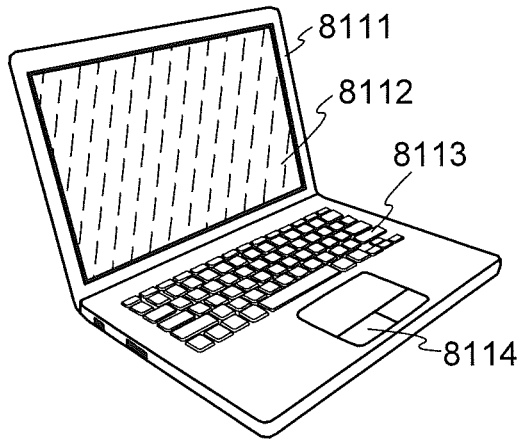

FIG. 19F illustrates a laptop personal computer, which includes a housing 8111, a display portion 8112, a keyboard 8113, a pointing device 8114, and the like.

The display device of one embodiment of the present invention can be used in the display portion 8112.

At least part of this embodiment can be implemented in combination with any of the other embodiments described in this specification as appropriate.

This application is based on Japanese Patent Application serial No. 2016-125126 filed with Japan Patent Office on Jun. 24, 2016, the entire contents of which are hereby incorporated by reference.

What is claimed is:

1. A display device comprising:
   a self-luminous display element comprising:
      a first transistor; and
      a first electrode;
   a reflective display element; and
   a second transistor,
   wherein the first electrode is electrically connected to a source electrode or a drain electrode of the first transistor,
   wherein the reflective display element comprises a light-reflective layer and a layer comprising a liquid crystal material,
   wherein the layer comprising the liquid crystal material comprises a region located between the light-reflective layer and the self-luminous display element,
   wherein the self-luminous display element transmits visible light,
   wherein the reflective display element comprises a second electrode and a third electrode,
   wherein the second electrode and the third electrode can generate an electric field in the reflective display element, wherein the electric field can control alignment of the liquid crystal material of the layer comprising the liquid crystal material, wherein the second electrode is electrically connected to a source electrode or a drain electrode of the second transistor, wherein the second transistor comprises a first gate insulating film, wherein the first transistor comprises a second gate insulating film, wherein the second gate insulating film comprises a region overlapping with the first gate insulating film, wherein the layer comprising the liquid crystal material comprises a region located between the first gate insulating film and the second gate insulating film, and wherein the first electrode comprises a region located between the layer comprising the liquid crystal material and the second gate insulating film.

2. The display device according to claim 1, further comprising a polarizing plate, wherein the self-luminous display element comprises a region located between the layer comprising the liquid crystal material and the polarizing plate.

3. The display device according to claim 1, further comprising one coloring film or two or more coloring films, wherein the one coloring film or one of the two or more coloring films comprises at least a region located between the layer comprising the liquid crystal material and the self-luminous display element.

4. The display device according to claim 1, further comprising one coloring film or two or more coloring films, wherein the self-luminous display element comprises at least a region located between the one coloring film or one of the two or more coloring films and the layer comprising the liquid crystal material.

5. The display device according to claim 1, further comprising a support substrate, wherein the support substrate comprises at least a region located between the layer comprising the liquid crystal material and the self-luminous display element.

6. The display device according to claim 1, wherein the first transistor, the second transistor, the layer comprising the liquid crystal material, and the self-luminous display element are each located between a polarizing plate and the light-reflective layer.

7. The display device according to claim 1, further comprising:

a first substrate; and a second substrate, wherein the first transistor, the second transistor, the layer comprising the liquid crystal material, and the self-luminous display element are located between the first substrate and the second substrate.

8. A semiconductor device comprising:

one or more of a keyboard, a hardware button, a pointing device, a touch sensor, an illuminance sensor, an imaging device, an audio input device, a viewpoint input device, and a pose detection device; and the display device according to claim 1.

9. A display device comprising:

a self-luminous display element comprising:

a first transistor; and a first electrode;

a reflective display element; and a second transistor, wherein the first electrode is electrically connected to a source electrode or a drain electrode of the first transistor, wherein the reflective display element comprises a light-reflective layer and a layer comprising a liquid crystal material, wherein the layer comprising the liquid crystal material comprises a region located between the light-reflective layer and the self-luminous display element, wherein the self-luminous display element transmits visible light, wherein the second transistor comprises a first gate insulating film, wherein the first transistor comprises a second gate insulating film, wherein the reflective display element comprises a second electrode and a third electrode, wherein the second electrode and the third electrode can generate an electric field in the reflective display element, wherein the electric field can control alignment of the liquid crystal material of the layer comprising the liquid crystal material, wherein the first electrode is one of electrodes of the self-luminous display element, wherein the second electrode is electrically connected to a source electrode or a drain electrode of the second transistor, wherein the layer comprising the liquid crystal material comprises a region located between the first gate insulating film and the first electrode, and wherein the first electrode comprises a region located between the layer comprising the liquid crystal material and the second gate insulating film.

* * * * *